United States Patent
Kando

(10) Patent No.: US 7,501,916 B2
(45) Date of Patent: Mar. 10, 2009

(54) ELASTIC WAVE DEVICE HAVING AN ELECTRODE FINGER WITH A SIDE EDGE PROJECTION

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 5 days.

(21) Appl. No.: 11/843,776

(22) Filed: Aug. 23, 2007

(65) Prior Publication Data
US 2007/0296528 A1    Dec. 27, 2007

Related U.S. Application Data

(63) Continuation of application No. PCT/JP2006/306811, filed on Mar. 31, 2006.

(30) Foreign Application Priority Data
Apr. 8, 2005   (JP) .............................. 2005-112273

(51) Int. Cl.
*H03H 9/145* (2006.01)
*H03H 9/25* (2006.01)
*H03H 9/64* (2006.01)

(52) U.S. Cl. .................. 333/194; 333/196; 310/313 B; 310/313 C

(58) Field of Classification Search ................. 333/194, 333/196
See application file for complete search history.

(56) References Cited

U.S. PATENT DOCUMENTS
7,009,325 B2   3/2006  Kando et al.

2002/0140316 A1   10/2002  Yamanouchi
2004/0247153 A1*  12/2004  Ruile et al. ................. 381/431
2005/0057323 A1*   3/2005  Kando ........................ 333/141

FOREIGN PATENT DOCUMENTS

| JP | 61-029531 U  |   | 2/1986  |
|----|--------------|---|---------|
| JP | 05-067938 A  |   | 3/1993  |
| JP | 06-164297 A  |   | 6/1994  |
| JP | 6-66130 U    |   | 9/1994  |
| JP | 06-350383    | * | 12/1994 |
| JP | 2003-209458 A|   | 7/2003  |
| JP | 2004-236285 A|   | 8/2004  |
| JP | 2004-260543 A|   | 9/2004  |
| WO | 98/52279 A1  |   | 11/1998 |

OTHER PUBLICATIONS

Official Communication for PCT Application No. PCT/JP2006/306811; mailed Jun. 27, 2006.

* cited by examiner

*Primary Examiner*—Barbara Summons
(74) *Attorney, Agent, or Firm*—Keating & Bennett, LLP

(57) ABSTRACT

An elastic wave device includes at least one IDT electrode provided on a piezoelectric substrate. The at least one IDT electrode includes first and second electrode fingers arranged next to each other in a propagation direction of elastic wave. The side edges of at least the electrode finger of the first and second electrode fingers are provided with projections. The position of the projections in the longitudinal direction of the electrode fingers substantially corresponds with the position of a gap in the longitudinal direction of the electrode fingers, the gap being provided at the tip end of the electrode finger of the first and second electrode fingers.

39 Claims, 15 Drawing Sheets

ELASTIC WAVE DEVICE HAVING AN ELECTRODE FINGER WITH A SIDE EDGE PROJECTION

BACKGROUND OF THE INVENTION

1. Field of the Invention

The present invention relates to elastic wave devices used as, for example, resonators and band-pass filters, and particularly, to an elastic wave device in which an IDT electrode having a plurality of electrode fingers has an improved structure.

2. Description of the Related Art

Elastic wave devices have been used widely as resonators and band-pass filters. Known examples of elastic wave devices are surface acoustic wave devices that utilize surface acoustic waves and boundary acoustic wave devices that utilize boundary acoustic waves.

Japanese Unexamined Patent Application Publication No. 2004-236285 discusses a boundary acoustic wave resonator in which first and second solid layers are stacked one on top of the other, and at least one normal IDT electrode (interdigital electrode) is disposed in the interface between the first solid layer and the second solid layer. A boundary acoustic wave device of this kind or a surface acoustic wave device is generally equipped with an IDT electrode having a plurality of electrode fingers in order to excite boundary acoustic waves or surface acoustic waves.

Japanese Unexamined Patent Application Publication No. 2004-260543 discloses a surface acoustic wave device having a weighted IDT electrode. FIG. 18 is a schematic plan view showing an electrode structure of the surface acoustic wave device disclosed in Japanese Unexamined Patent Application Publication No. 2004-260543.

A surface acoustic wave device 101 is a filter device that utilizes surface acoustic waves and has input terminals IN and output terminals OUT. Moreover, first and second filters are provided on a piezoelectric substrate so as to constitute the electrode structure shown in the drawing. The first filter has a weighted excitation IDT electrode 102 and a normal-type receiving IDT electrode 103. On the other hand, the second filter has a normal-type excitation IDT electrode 104 and a weighted receiving IDT electrode 105. One of the weighted IDT electrodes 102, 105 is weighted so as to have the minimum phase characteristics, whereas the other is weighted such as to have the maximum phase characteristics.

The weighting is implemented by a crossing width weighting technique. For example, in the case of adjacent electrode fingers 102a and 102b in the IDT electrode 102, a gap 102c provided at the tip end of each electrode finger 102a and a gap 102d provided for each electrode finger 102b are provided at different positions in a direction perpendicular to the propagation direction of surface acoustic waves, or in other words, in the direction in which the electrode fingers 102a, 102b extend.

In the boundary acoustic wave device according to Japanese Unexamined Patent Application Publication No. 2004-236285, a normal IDT electrode is disposed in the interface between the first and second solid layers. In the surface acoustic wave device or boundary acoustic wave device disclosed in Japanese Unexamined Patent Application Publication No. 2004-260543, a technique in which the IDT electrodes are crossing width weighted to attain desired filter characteristics and resonance characteristics has been widely used.

However, in the boundary acoustic wave devices and surface acoustic wave devices of the related art, even with the use of weighted IDT electrodes, it is still difficult to attain sufficient resonance characteristics and filter characteristics. For this reason, improvements in the characteristics are in great demand.

SUMMARY OF THE INVENTION

In order to overcome the problems described above, preferred embodiments of the present invention provide an elastic wave device having a structure that allows for enhanced resonance characteristics and filter characteristics.

According to a preferred embodiment of the present invention, an elastic wave device includes a piezoelectric member and at least one IDT electrode. The at least one IDT electrode has first and second electrode fingers that are arranged next to each other in a propagation direction of elastic wave and are connected to different electric potentials. Gaps are provided external to tip ends of the first and second electrode fingers in a longitudinal direction of the electrode fingers. A projection is provided in at least one of a position on a side edge of the first electrode finger and a position on a side edge of the second electrode finger, the position on the side edge of the first electrode finger corresponding to that of the gap located external to the tip end of the second electrode finger in the longitudinal direction of the electrode fingers, the position on the side edge of the second electrode finger corresponding to that of the gap located external to the tip end of the first electrode finger in the longitudinal direction of the electrode fingers.

In another aspect of the elastic wave device according to a preferred embodiment of the present invention, the electrode finger having the gap that is adjacent to the projection in the propagation direction of elastic wave and that is located at the tip end of the electrode finger is tapered toward the tip end of the electrode finger.

In another aspect of the elastic wave device according to a preferred embodiment of the present invention, a distance between a periphery of the first electrode finger and a periphery of the second electrode finger arranged next to the first electrode finger is substantially fixed.

In another aspect of the elastic wave device according to a preferred embodiment of the present invention, the projection is arranged such that an effective propagation distance in a case where an elastic wave propagates through the gaps in an area provided with the first and second electrode fingers is substantially equal to an effective propagation distance in a case where an elastic wave propagates through a section without the gaps in the area provided with the first and second electrode fingers.

In another aspect of the elastic wave device according to a preferred embodiment of the present invention, the projection projects from the side edge of one of the first and second electrode fingers towards the gap provided at the tip end of the other electrode finger, the side edge from which the projection projects being one of the side edges that faces the gap.

In the elastic wave device according to a preferred embodiment of the present invention, the projection preferably has a trapezoid shape in plan view such that a lower base of the trapezoid is defined by the side edge of the electrode finger that is provided with the projection, and an internal angle formed between the lower base and sides of the trapezoid that connect an upper base and the lower base of the trapezoid is about 90° or less.

In another aspect of the elastic wave device according to a preferred embodiment of the present invention, assuming that the lower base of the projection has a midpoint in the longitudinal direction of the electrode fingers and the gap at the tip end of the other electrode finger has a center in the longitudinal direction of the electrode fingers, a position of the midpoint substantially corresponds with a position of the center in the longitudinal direction of the electrode fingers. The lower base has a length that is larger than a gap width, the gap width being a dimension of the gap in the longitudinal direction of the electrode fingers. The upper base has a length that is smaller than the gap width.

In a certain definitive aspect of the elastic wave device according to a preferred embodiment of the present invention, the projection has an isogonal trapezoid shape in plan view although the shape is not specifically limited thereto.

In another aspect of the elastic wave device according to a preferred embodiment of the present invention, the projection has a plurality of corner portions, the plurality of corner portions being rounded.

In another aspect of the elastic wave device according to a preferred embodiment of the present invention, the projection has a planar shape that has a bottom side that continues from the side edge of the electrode finger and a periphery edge that is curved except for the bottom side.

In another aspect of the elastic wave device according to a preferred embodiment of the present invention, assuming that the bottom side of the projection has a midpoint in the longitudinal direction of the electrode fingers and the gap is bisected by a line with respect to the longitudinal direction of the electrode fingers, a position of the midpoint substantially corresponds with a position of the bisecting line in the longitudinal direction of the electrode fingers. Moreover, the bottom side has a length that is larger than the gap width.

In another aspect of the elastic wave device according to a preferred embodiment of the present invention, the projection is also provided on the other one of the first and second electrode fingers. Specifically, in the longitudinal direction of the electrode fingers, the position of the projection provided on the other one of the first and second electrode fingers in the longitudinal direction of the electrode fingers substantially corresponds with the position of the gap provided at the tip end of the one of the first and second electrode fingers.

In another aspect of the elastic wave device according to a preferred embodiment of the present invention, the at least one IDT electrode is crossing width weighted.

In the elastic wave device according to a preferred embodiment of the present invention, the elastic wave is a surface acoustic wave or a boundary acoustic wave. By utilizing surface acoustic waves, a surface acoustic wave device can be provided. By utilizing boundary acoustic waves, a boundary acoustic wave device can be provided.

In another aspect of the elastic wave device according to a preferred embodiment of the present invention, a medium layer is preferably included and arranged to cover the at least one IDT electrode provided on the piezoelectric substrate. The at least one IDT electrode has a density that is equal to or higher than a density of the piezoelectric substrate and a density of the medium layer. Moreover, a ratio of the density of the at least one IDT electrode to the density of the medium layer is preferably higher than about 1.22.

In another aspect of the elastic wave device according to a preferred embodiment of the present invention, a medium layer is preferably included and stacked on the at least one IDT electrode provided on the piezoelectric substrate so as to cover the at least one IDT electrode. The at least one IDT electrode has a density that is equal to or higher than a density of the piezoelectric substrate and a density of the medium layer. A ratio of the density of the at least one IDT electrode to one of the higher densities of the piezoelectric substrate and the medium layer is preferably higher than about 1.22.

In the elastic wave device according to preferred embodiments of the present invention, the IDT electrode has first and second electrode fingers that are arranged next to each other in a propagation direction of elastic waves and are connected to different electric potentials. Moreover, gaps are provided external to tip ends of the first and second electrode fingers. A projection is provided in at least one of a position on a side edge of the first electrode finger and a position on a side edge of the second electrode finger, the position on the side edge of the first electrode finger corresponding to that of the gap located external to the tip end of the second electrode finger in the longitudinal direction of the electrode fingers, and the position on the side edge of the second electrode finger corresponding to that of the gap located external to the tip end of the first electrode finger in the longitudinal direction of the electrode fingers. Therefore, as will be apparent from the description of preferred embodiments below, a phase shift that occurs between an elastic wave propagating through an area provided with the gaps and an elastic wave propagating through an area without the gaps can be compensated for. Accordingly, this allows for enhanced resonance characteristics and filter characteristics. In particular, when the IDT electrode has crossing width weighting, not only are the characteristics enhanced due to the crossing width weighting, but the resonance characteristics and the filter characteristics are more effectively enhanced due to the formation of the projection.

In a case where the electrode finger having the gap that is adjacent to the projection in the propagation direction of elastic wave and that is located at the tip end of the electrode finger is tapered toward the tip end of the electrode finger, the tapered portion of the electrode finger and the projection are separated from each other by a sufficient distance. Consequently, this effectively enhances the resistance to electrical power.

When the distance between the peripheries of the first electrode finger and the second electrode finger is substantially fixed, an electric field is substantially prevented from concentrating in a certain area, whereby the resistance to electrical power can be further enhanced.

In the elastic wave device according to various preferred embodiments of the present invention, when the projection is arranged such that an effective distance of an elastic wave propagating through the gaps in the area provided with the first and second electrode fingers is substantially equal to an effective distance of an elastic wave propagating through a section without the gaps in the area provided with the first and second electrode fingers, the aforementioned phase shift of elastic waves can be compensated for more effectively.

In a case where the projection projects from the side edge of the first electrode finger towards the corresponding gap, the sides of the projection are slanted at an angle. For example, when the projection has, for example, a trapezoid shape in plan view, a boundary wave propagating towards the gap from the sides of the projection is refracted as the boundary wave propagates outward from the sides. This allows the boundary wave to be concentrated effectively in the gap.

In a case where the projection has a trapezoid shape in plan view such that a lower base of the trapezoid is defined by the side edge of the corresponding electrode finger, and the angle formed between the lower base and sides of the trapezoid that connect an upper base and the lower base of the trapezoid is about 90° or less, an elastic wave propagates by being refracted towards the inner portion of the corresponding gap. This can effectively minimize diffraction loss in the gap, whereby the resonance characteristics and filter characteristics can be enhanced more effectively.

Assuming that the lower base of the projection has a midpoint in the longitudinal direction of the electrode fingers and the other gap is bisected by a line with respect to the longitudinal direction of the electrode fingers, the position of the midpoint substantially corresponds with the position of the bisecting line in the longitudinal direction of the electrode fingers. Moreover, the lower base has a length that is larger than a gap width, the gap width being a dimension of the gap in the longitudinal direction of the electrode fingers. Furthermore, the upper base has a length that is smaller than the gap width. In this case, an elastic wave refracted at the sides of the projection passes through the gap while hardly being affected by the electrode having the gap at the tip end thereof. This allows for further effective minimization of diffraction loss, thereby achieving further enhanced resonance characteristics and filter characteristics.

In a case where the projection has an isogonal trapezoid shape, the propagation state of elastic waves can be balanced out at both sides of the gap in the longitudinal direction of the electrode fingers, thereby achieving further enhanced resonance characteristics and filter characteristics.

In a case where the projection has a plurality of corner portions and the plurality of corner portions is rounded, a phase shift that occurs between an elastic wave propagating through an area provided with the gaps and an elastic wave propagating through an area without the gaps can be compensated for.

Similarly, in a case where the projection has a planar shape that has a bottom side that continues from the side edge of the electrode finger and a periphery edge that is curved except for the bottom side, a phase shift that occurs between an elastic wave propagating through an area provided with the gaps and an elastic wave propagating through an area without the gaps can be compensated for.

Assuming that the bottom side of the projection has a midpoint in the longitudinal direction of the electrode fingers and the gap is bisected by a line with respect to the longitudinal direction of the electrode fingers, the position of the midpoint substantially corresponds with the position of the bisecting line in the longitudinal direction of the electrode fingers. Moreover, the bottom side has a length that is larger than the gap width. In this case, an elastic wave refracted in an area where a tangent line of an edge of the projection and a normal line of the side edge of the electrode finger have an angle therebetween passes through the gap with hardly being affected by the electrode having the gap at the tip end thereof. This allows for further effective minimization of diffraction loss, thereby achieving further enhanced resonance characteristics and filter characteristics.

In a case where the projection is also provided on the other one of the first and second electrode fingers, a phase shift occurring when an elastic wave propagates through the IDT electrode can be more effectively suppressed in accordance with preferred embodiments of the present invention. If a metal having a high density, such as Au, Cu, or Ag, is used for the IDT electrode, a difference between the acoustic impedance in the IDT electrode and the acoustic impedance in the piezoelectric substrate and the medium layer become large, and the acoustic velocity ratio of boundary acoustic waves in the metallized area and the non-metallized area of the IDT electrode becomes high. Generally, when the acoustic velocity ratio of boundary acoustic waves becomes high, the phase shifts and diffraction losses mentioned above tend to occur readily. In contrast, in preferred embodiments of the present invention, phase shifts can be compensated for by the projections. Therefore, even in a boundary acoustic wave device in which the density ratio is high, deterioration in the resonance characteristics and filter characteristics caused by phase shifts can be effectively suppressed.

In a case where the IDT electrode has crossing width weighting, the crossing width weighting allows for achievement of desired resonance characteristics and filter characteristics. In addition, phase shifts of elastic waves can be compensated for in accordance with preferred embodiments of the present invention, whereby favorable resonance characteristics and filter characteristics can be attained.

In the elastic wave device according to preferred embodiments of the present invention, surface acoustic waves or boundary acoustic waves may be used as elastic waves. In either case, preferred embodiments of the present invention provide a surface acoustic wave device or a boundary acoustic wave device that achieves favorable resonance characteristics and filter characteristics. In the case of boundary acoustic waves, the acoustic velocity of boundary acoustic waves is preferably set lower than the acoustic velocity of upper and lower medium layers in order to reduce propagation loss of the boundary acoustic waves. Such a state increases the weight of the IDT electrode. In other words, this setting can be achieved by increasing the density of the IDT electrode. However, when the density becomes higher, a difference in acoustic characteristic impedance between a metallized area and a space area becomes greater, leading to a large degree of phase shift in the boundary acoustic waves due to diffraction occurring in the gaps at the tip ends of the electrode fingers and variations in effective propagation distances. This tends to increase the degree of adverse effect on the characteristics. In particular, when the ratio of the density of the IDT electrode to one of the higher densities of the piezoelectric substrate and the medium layer is equal to or higher than about 1.22, the propagation loss can be minimized and the advantageous effects of preferred embodiments of the present invention are more prominent.

Other features, elements, steps, characteristics and advantages of the present invention will be described below with reference to preferred embodiments thereof and the attached drawings.

DETAILED DESCRIPTION OF PREFERRED EMBODIMENTS

Preferred embodiments of the present invention will now be described with reference to the drawings.

First Preferred Embodiment

Figure 1A:
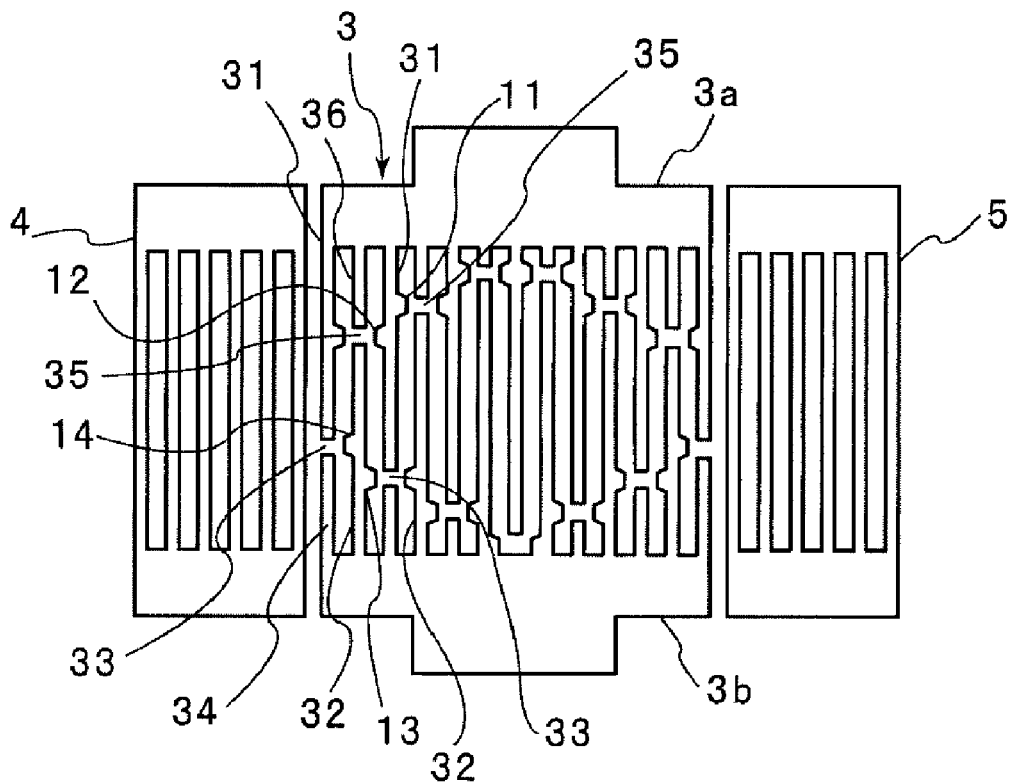
FIG. 1A is a schematic cross-sectional plan view showing an electrode structure of a boundary acoustic wave device according to a first preferred embodiment of the present invention and FIG. 1B is schematic cross-sectional plan view showing a relevant section of FIG. 1A.
Figure 1B:
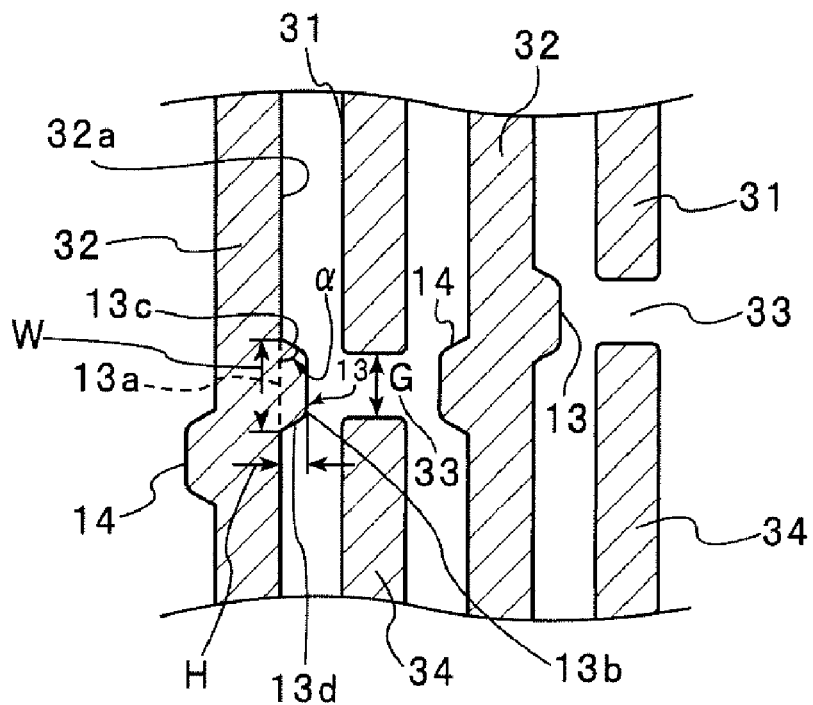
Figure 2:
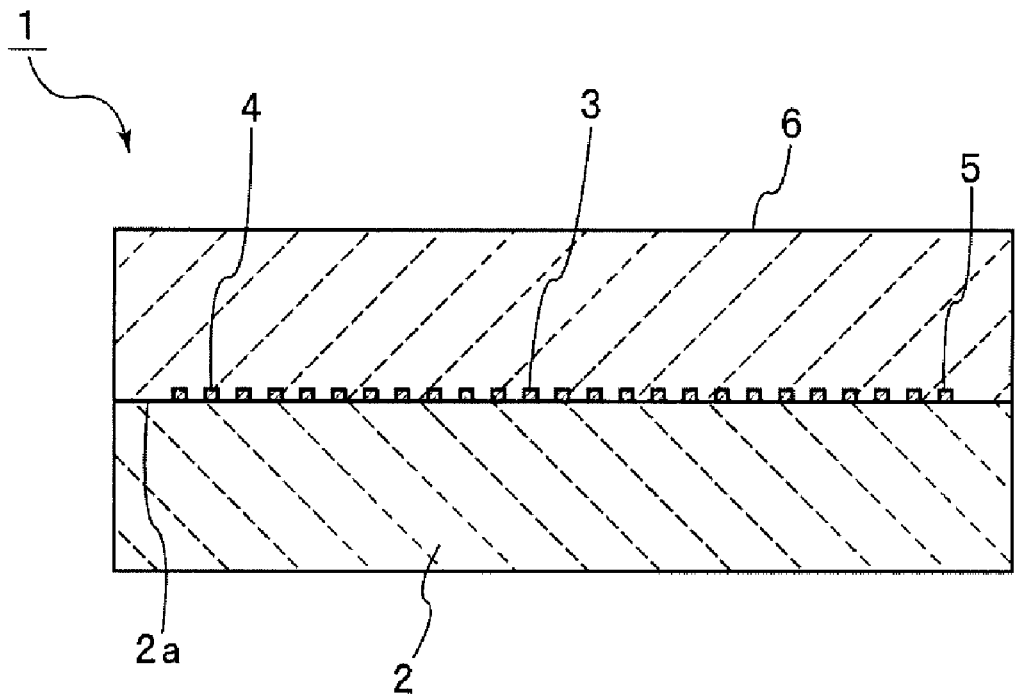
FIG. 2 is a front sectional view of the boundary acoustic wave device according to the first preferred embodiment shown in FIG. 1.

FIG. 2 is a front sectional view of a boundary acoustic wave device according to a first preferred embodiment of the present invention. FIG. 1A is a schematic cross-sectional plan view showing an electrode structure of the boundary acoustic wave device and FIG. 1B is a schematic plan view of an enlarged section of the boundary acoustic wave device.

As shown in FIG. 2, a boundary acoustic wave device 1 includes a piezoelectric substrate 2, an IDT electrode 3 provided on a top surface 2a of the piezoelectric substrate 2, reflectors 4 and 5, and a medium layer 6 coated over the IDT electrode 3 and the reflectors 4 and 5.

Specifically, the IDT electrode 3 is provided in an interface between the piezoelectric substrate 2 and the medium layer 6.

In the first preferred embodiment, the piezoelectric substrate 2 is preferably formed of a LiNbO$_3$ substrate. Alternatively, the piezoelectric substrate 2 may be formed of other piezoelectric single-crystal substrates, such as a LiTaO$_3$ substrate or a quartz substrate, or may be formed of a piezoelectric ceramic substrate. The density of the piezoelectric substrate 2 formed of a LiNbO$_3$ substrate preferably is about 4.64 g/cm$^3$, for example.

On the other hand, the medium layer 6 in the first preferred embodiment is preferably composed of SiO$_2$, and the density thereof preferably is about 2.2 g/cm$^3$, for example. The material used for the medium layer 6 is not limited to SiO$_2$. The medium layer 6 may be composed of other insulating materials, such as SiN.

The IDT electrode 3 and the reflectors 4, 5 may be composed of an appropriate metal such as Ag, or an appropriate metal alloy. In the first preferred embodiment, the IDT electrode 3 and the reflectors 4, 5 are preferably composed of Au. A preferred combination between the material used for the IDT electrode 3 and the materials used for the piezoelectric substrate 2 and the medium layer 6 will be described in detail below.

As shown in FIG. 1A, the IDT electrode 3 includes a pair of bus bars 3a, 3b extending in a propagation direction of boundary acoustic waves. A plurality of first electrode fingers 31 and a plurality of second electrode fingers 32 are alternately arranged in the propagation direction of boundary acoustic waves. The first and second electrode fingers 31, 32 extend in a direction perpendicular or substantially perpendicular to the propagation direction of boundary acoustic waves. First ends of the plurality of first electrode fingers 31 are connected to the second bus bar 3a, whereas second ends thereof extend towards the second bus bar 3b. Each of the first electrode fingers 31 has a gap 33 disposed at a tip end thereof. A dummy electrode finger 34 is arranged opposite to each first electrode finger 31 across the corresponding gap 33. Each dummy electrode finger 34 is connected to the bus bar 3b.

On the other hand, first ends of the plurality of second electrode fingers 32 are connected to the bus bar 3b, whereas second ends thereof extend towards the first bus bar 3a. Each of the second electrode fingers 32 has a gap 35 disposed at a tip end thereof. A dummy electrode finger 36 is disposed opposite to each second electrode finger 32 across the corresponding gap 35. Each dummy electrode finger 36 is connected to the bus bar 3a.

In the first preferred embodiment, the IDT electrode 3 is constituted by a first comb-like electrode portion having the plurality of first electrode fingers 31 and the bus bar 3a and a second comb-like electrode portion having the plurality of second electrode fingers 32 and the bus bar 3b. In the IDT electrode 3, the plurality of first electrode fingers 31 and the plurality of second electrode fingers 32 interdigitate with each other.

As is apparent from FIG. 1A, in the IDT electrode 3 having the plurality of first electrode fingers 31, 32, the locations of the gaps 33, 35 in the longitudinal direction of the electrode fingers 31, 32 vary in the propagation direction of boundary acoustic waves. In other words, crossing width weighting is applied such that overlapping sections of adjacent first and second electrode fingers 31, 32 in the propagation direction of boundary acoustic waves vary in the propagation direction of boundary acoustic waves. More specifically, the crossing width, which is the dimension of crossing areas, varies in the propagation direction of boundary acoustic waves.

In order to attain resonance characteristics with the IDT electrode 3, a specific design for the crossing width weighting is determined in the designing stage.

On the other hand, each of the reflectors 4, 5 in the first preferred embodiment is a grating reflector having a plurality of electrode fingers short-circuited at both ends thereof. The reflectors 4, 5 are disposed on both sides of the IDT electrode 3 in the propagation direction of boundary acoustic waves. Alternatively, each of the reflectors may be an open-type reflector that is not short-circuited at its both ends.

The boundary acoustic wave device 1 according to the first preferred embodiment is characterized in that the side edges of the first and second electrode fingers 31, 32 in the IDT electrode 3 are provided with projections 11, 12 and projections 13, 14, which are located at positions facing the gaps 35 and the gaps 33. This will be described in detail with reference to FIG. 1B.

FIG. 1B shows an enlarged section of adjacent first electrode fingers 31 and second electrode fingers 32. The side edges of each second electrode finger 32 are provided with projections 13, 14. Each projection 13 projects from a section of a side edge 32a of the corresponding electrode finger 32 towards the gap 33 that is disposed at the tip end of the corresponding first electrode finger 31. The position of each projection 13 in the longitudinal direction of the electrode fingers 31, 32 substantially corresponds with the position of the corresponding gap 33 in the longitudinal direction of the electrode fingers.

The positional relationship between each projection 13 and the corresponding gap 33 is most preferably set such that their positions correspond with each other in the longitudinal direction of the electrode fingers 31, 32. However, their positions do not necessarily need to correspond with each other as long as they do not impair the advantages achieved by preferred embodiments of the present invention.

In the first preferred embodiment, the projections 13 have an isogonal trapezoid shape in plan view. Specifically, a portion of each projection 13 that continues along the corresponding side edge 32a corresponds to a lower base of the isogonal trapezoid, and the tip end portion of the projection 13 corresponds to an upper base 13b. The upper base 13b and the lower base 13a are connected to each other through sides 13c, 13d that are slanted to form an internal angle α with respect to the lower base 13a.

The center of the lower base 13a in the longitudinal direction of the electrode fingers is aligned with the center of the corresponding gap 33 in the longitudinal direction of the electrode fingers. In other words, in the longitudinal direction of the electrode fingers, an electrode-finger longitudinal position that bisects each gap 33 with respect to the longitudinal direction of the electrode fingers is aligned with a midpoint of the corresponding lower base 13a in the longitudinal direction of the electrode fingers. Due to the isogonal trapezoid shape, the internal angle α is about 90° or less.

In the description below, the dimension of each gap 33 in the longitudinal direction of the electrode fingers will be defined as a gap width G. The maximum dimension of each projection 13 in the longitudinal direction of the electrode fingers, in other words, the dimension of the lower base 13a of each projection 13 in the longitudinal direction of the electrode fingers will be defined as W. The projection height of each projection 13, in other words, the dimension from the side edge 32a of the corresponding electrode finger 32 to the upper base 13b, which is the tip end of the projection 13, will be defined as a projection height H of each projection 13.

Figure 3:
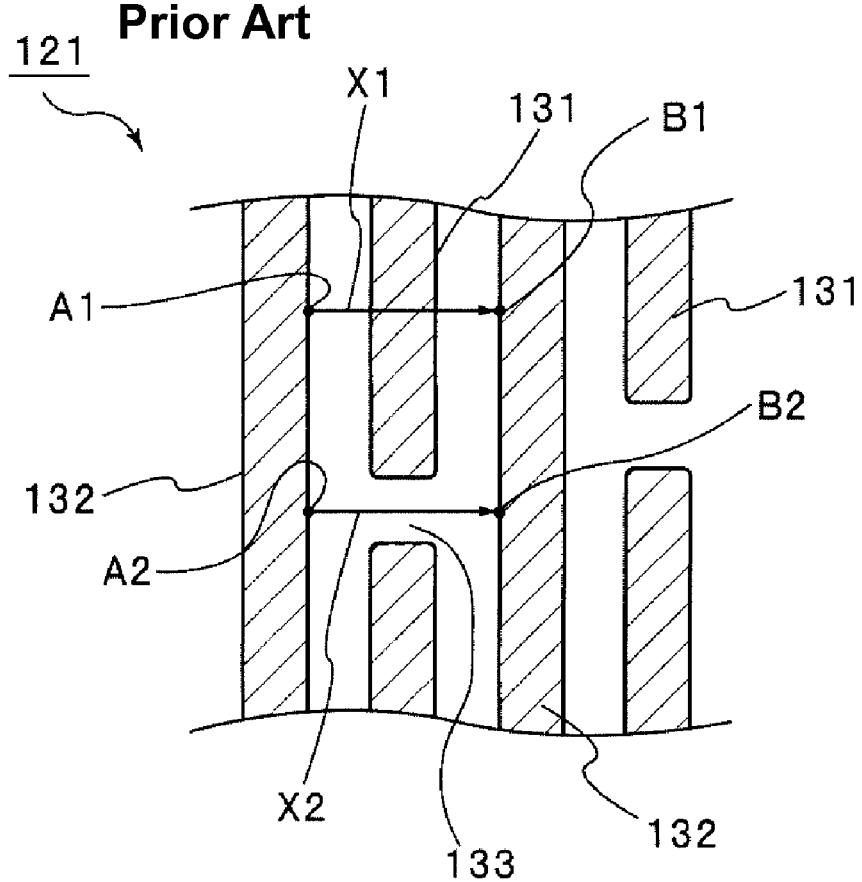
FIG. 3 is a schematic plan view illustrating problems in a boundary acoustic wave device of related art.

As described above, boundary acoustic wave devices and surface acoustic wave devices equipped with an IDT electrode having crossing width weighting applied thereto have been known. FIG. 3 is a schematic plan view illustrating propagation paths of boundary acoustic waves in a boundary acoustic wave device of related art. In the boundary acoustic wave device of the related art, crossing width weighting is applied to reduce transverse mode spurious. FIG. 3 is a schematic plan view of an enlarged section of an IDT electrode with crossing width weighting, and corresponds to FIG. 1B showing the first preferred embodiment.

In the elastic wave device 121, first electrode fingers 131 and second electrode fingers 132 are arranged next to each other in the propagation direction of boundary acoustic waves, and are crossing width weighted so that each first electrode finger 131 has a gap 133 disposed at the tip end thereof. In this area, boundary acoustic waves propagate as shown with arrows X1 and X2.

On a propagation path indicated by the arrow X1, a boundary acoustic wave travels from a second electrode finger 132, passes through a first electrode finger 131, and then reaches the next second electrode finger 132. On the other hand, in an area provided with a gap 133, a boundary acoustic wave propagating from a second electrode finger 132 passes through the gap 133 as shown with the arrow X2 and then reaches the next second electrode finger 132.

The acoustic velocity of a boundary acoustic wave passing through the electrode fingers 131, 132 differs from the acoustic velocity in an area where there are no electrode fingers 131, 132. A time T1 that takes a boundary acoustic wave to travel from point A1 to point B1 shown with the arrow X1 in FIG. 3 can be expressed as follows:

$$T1 = L/Vm + 2 \cdot S/Vs \qquad \text{Expression (1)}$$

where Vm represents the acoustic velocity of a boundary acoustic wave in the electrode fingers 131, 132; Vs represents the acoustic velocity of a boundary acoustic wave on a piezoelectric substrate surface where there are no electrode fingers; and S=P−L, L representing the width of the electrode fingers 131, 132 and P representing the arrangement pitch of the electrode fingers 131, 132.

On the other hand, in an area provided with a gap 133, a time T2 that takes a boundary acoustic wave to travel from point A2 to point B2 through the gap 133 in FIG. 3 can be expressed as follows:

$$T2 = L/Vs + 2 \cdot S/Vs \qquad \text{Expression (2)}$$

Thus, a time lag in travel time is expressed as follows:

$$T1 - T2 = L(1/Vm - 1/Vs) \qquad \text{Expression (3).}$$

This time lag occurs between a case where a boundary acoustic wave propagates through an area where there is no gap 133 and a case where a boundary acoustic wave propagates through an area with a gap 133. For this reason, concerning boundary acoustic waves that propagate through the IDT electrode in the boundary acoustic wave device 121 of the related art, a phase shift occurs on the basis of the time lag between a boundary acoustic wave that propagates through a gap and a boundary acoustic wave that does not propagate through a gap. This results in insufficient resonance characteristics.

Figure 4:
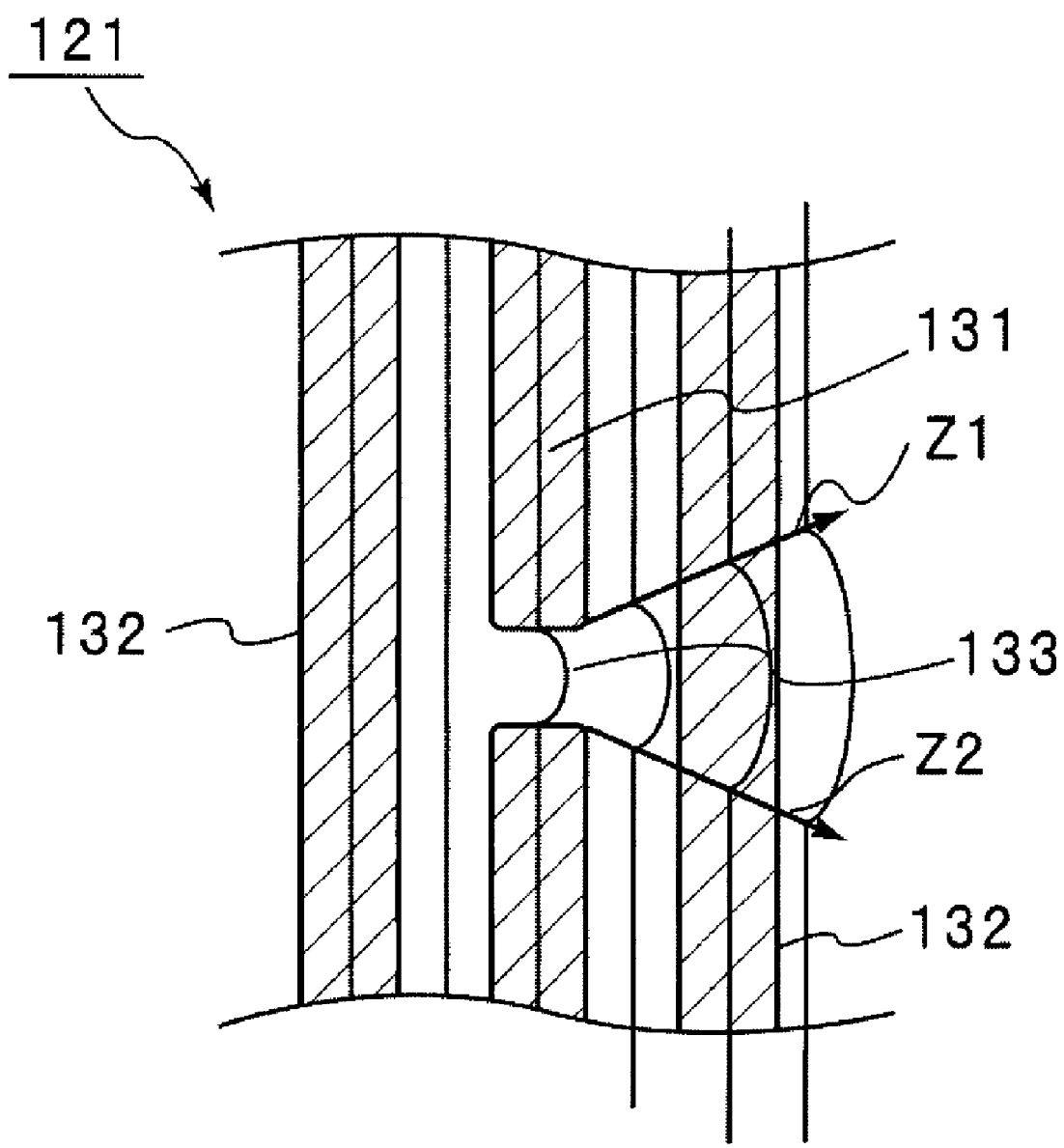
FIG. 4 is a schematic plan view illustrating a wave front of a boundary acoustic wave propagating through an IDT electrode in the boundary acoustic wave device of the related art.

FIG. 4 is a schematic plan view illustrating a wave front of a boundary acoustic wave propagating through the IDT electrode in the boundary acoustic wave device of the related art.

A boundary acoustic wave excited by the IDT forms a wave front in accordance with the shape of the electrode fingers of the IDT. In the boundary acoustic wave device 121, if the electrode fingers have a linear shape, the first electrode fingers 131 connected to one of the electric potentials and the second electrode fingers 132 connected to the other electric potential excite a plane wave that propagates therethrough. As shown with arrows Z1 and Z2 in FIG. 4, for example, a boundary acoustic wave is diffracted at both sides of the gap 133 in the longitudinal direction of the electrode fingers, the gap 133 being located at a tip end of one of the first electrode fingers 131. This causes turbulence in the wave front. Specifically, this turbulence in the wave front is assumed to cause deterioration in the resonance characteristics and filter characteristics.

In contrast, the second electrode fingers 32 in the boundary acoustic wave device 1 according to the first preferred embodiment are provided with the projections 13, 14, which project towards the corresponding gaps 33, as shown in FIG. 1B. Thus, a phase shift of the boundary waves propagating through the IDT electrode can be suppressed, thereby enhancing the resonance characteristics. This will be described with reference to FIG. 5A.

Figure 5A:
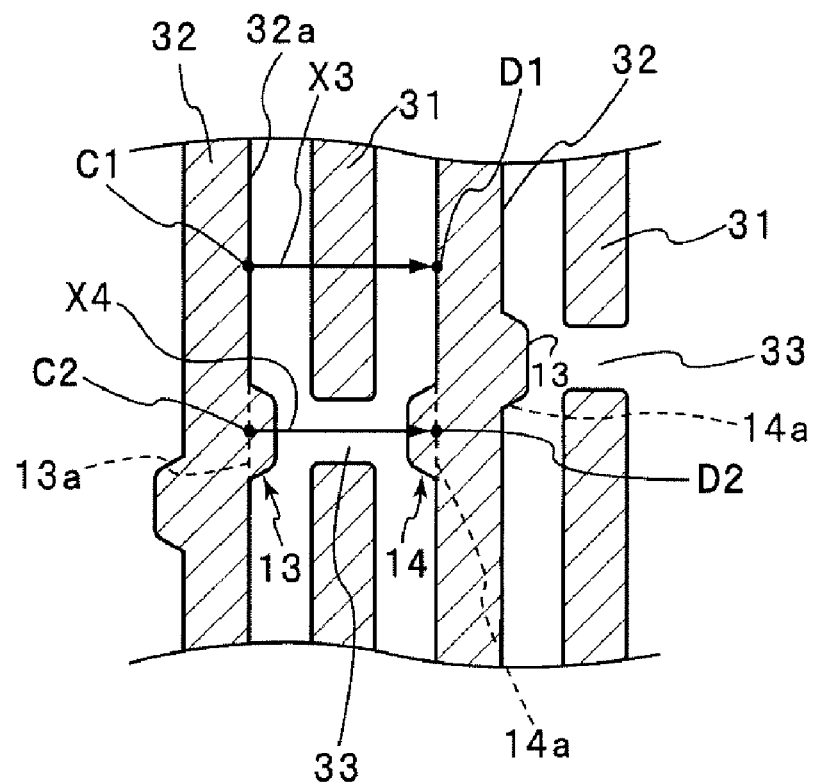
FIG. 5A is a schematic plan view that shows propagation paths of boundary acoustic waves to illustrate the effects of projections provided in the boundary acoustic wave device according to an embodiment.

FIG. 5A is a diagram that corresponds to FIG. 3 showing the example of related art, and illustrates the same section as that shown in FIG. 1B.

FIG. 5A illustrates a case where a boundary acoustic wave travels from point C1 on a side edge of a second electrode finger 32, passes through a first electrode finger 31, and then reaches point D1 on a side edge of the next second electrode finger 32, as shown with an arrow X3, and a case where a boundary acoustic wave propagates through an area with a gap 33, as shown with an arrow X4. On the propagation path of the boundary acoustic wave shown with the arrow X4, the boundary acoustic wave travels from point C2, which is a midpoint of the lower base 13a of the projection 13 continuing from the side edge of the electrode finger 32, passes through the gap 33, and then reaches the projection 14 provided on the side edge of the next electrode finger 32. Finally, the boundary acoustic wave reaches point D2, which is a midpoint of the lower base 14a of the projection 14.

Like the example of related art, it is assumed that the acoustic velocity of a boundary acoustic wave in an area with electrode fingers is represented by Vm, the acoustic velocity of a boundary acoustic wave in an area without a boundary acoustic wave is represent by Vs, and S=P−L, L representing the width of the electrode fingers and P representing the arrangement pitch of the electrode fingers. In this case, a time T3 that takes a boundary acoustic wave to travel from point C1 to point D1 as shown with the arrow X3 is equal to the time T1 obtained from Expression (1) in the example of related art.

On the other hand, a time T4 that takes a boundary acoustic wave to travel from point C2 to point D2 can be expressed as follows:

$$T4=(L/Vs+2\cdot H/Vm+2\cdot(S-H)/Vs \qquad \text{Expression (4)}$$

where H represents the projection height of the projections 13, 14.

Consequently, if the projection height H is expressed as $$H=L/2 \qquad \text{Expression (5),}$$

it is apparent from Expression (1) and Expression (4) that the travel times of the boundary acoustic waves propagating along arrows X3 and X4 are equal to each other.

Accordingly, in the first preferred embodiment, the projection height H of each of the projections 13, 14 is preferably set equal to H=L/2. However, although H is preferably set equal to L/2, the travel times can be made substantially the same even if H differs from L/2 by a slight amount. In addition, even if H is outside of a range substantially equal to L/2, or in other words, regardless of the dimension of the projection height H, the condition of propagation paths of boundary acoustic waves passing through the gaps 33 can be set similar to the condition of propagation paths of boundary acoustic waves in areas without the gaps 33 as long as the projections 13, 14 are provided. Accordingly, in preferred embodiments of the present invention, phase shifts can be properly compensated for so that the resonance characteristics can be enhanced.

Specifically, as is apparent from FIG. 5A, comparing the propagation path of the boundary acoustic wave shown with the arrow X3 to the propagation path of the boundary acoustic wave shown with the arrow X4, the projections 13, 14 allow the condition of the propagation path of the boundary acoustic wave passing through the gap 33 to be similar to that of the propagation path of the boundary acoustic wave shown with the arrow X3. Accordingly, the present invention achieves enhanced resonance characteristics.

Figure 5B:
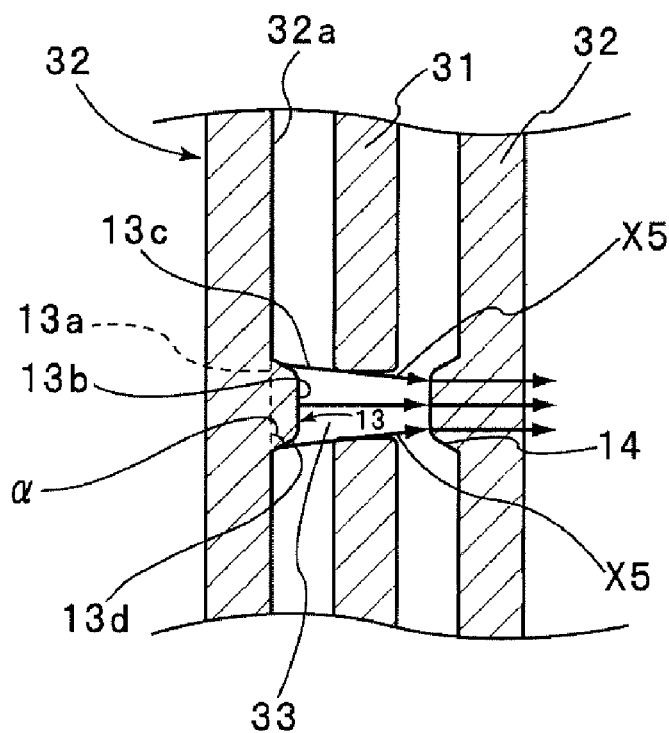
FIG. 5B is a schematic plan view illustrating a wave front of a boundary acoustic wave propagating through the IDT electrode.

FIG. 5B is a schematic plan view illustrating a wave front occurring when a boundary acoustic wave propagates through the IDT electrode in the first preferred embodiment. In each projection 13 having an isogonal trapezoid shape, the internal angle α, which is an angle of the sides 13c, 13d with respect to the lower base 13a, is about 90° or less. It is therefore apparent from FIG. 5B that the boundary acoustic wave propagates slantwise towards the center of the gap 33 as shown with arrows X5 in FIG. 5B.

Figure 6:
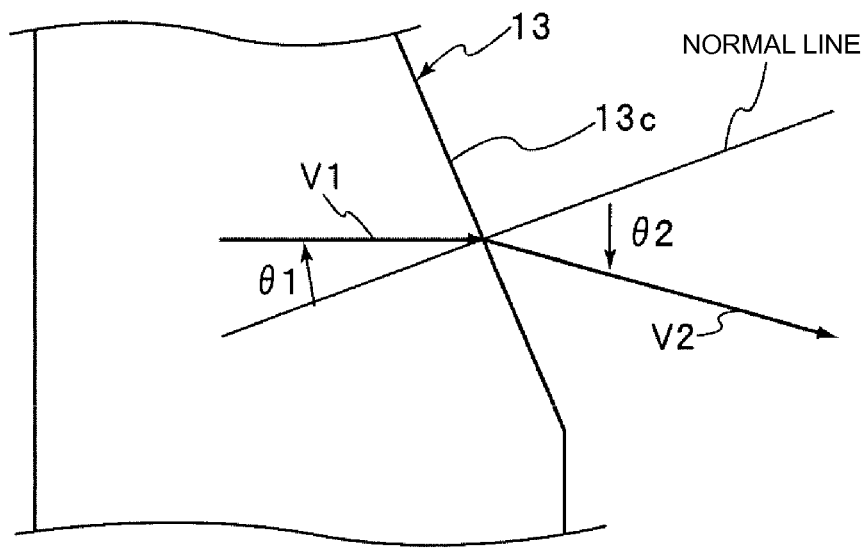
FIG. 6 is a schematic plan view illustrating a refraction phenomenon of a boundary acoustic wave propagating outward from a side of one of the projections in the boundary acoustic wave device of the embodiment shown in FIGS. 5A and 5B.

This phenomenon will be described in detail with reference to FIG. 6. FIG. 6 is a schematic plan view of the side 13c of one of the projections 13 and illustrates refraction of a boundary acoustic wave propagating towards a gap, which is occurring at the side 13c. The boundary acoustic wave that has reached the side 13c of the projection 13 is refracted at the side 13c which is slanted at an angle with respect to the traveling direction of the boundary acoustic wave. This occurs due to a difference between a propagation velocity V1 of the boundary acoustic wave in an area with an electrode and a velocity V2 of the boundary acoustic wave propagating through an area without an electrode, and is based on Snell's law.

In particular, when the boundary wave propagates towards the gap from the side 13c of the projection 13 as shown with arrows, the relationship sin θ/sin θ2=V1/V2 holds, where θ1 represents an angle formed between the boundary wave propagating through the projection and a normal line with respect to the side 13c, and θ2 represents an angle formed between the boundary acoustic wave propagating outward from the side 13c and the normal line. In this case, V1 and V2 represent the acoustic velocity of the boundary acoustic wave propagating through the projection and the acoustic velocity of the boundary acoustic wave propagating outward from the side 13c, respectively. In the case of FIG. 6 where the boundary acoustic wave is refracted outward from the side 13c, the acoustic velocity increases and the boundary acoustic wave travels toward the gap, whereby diffraction loss can be reduced. This enhances the resonance characteristics. Accordingly, as in the first preferred embodiment, the projections 13, 14 are preferably projected from the side edges of the electrode fingers provided with these projections 13, 14 such that the sides thereof are tapered towards the tip ends of the projections 13, 14. Specifically, like each projection 13 having an isogonal trapezoid shape in plan view, certain surfaces thereof are preferably tapered so that the diffraction loss can be effectively minimized.

Although the effects of only the projections 13, 14 in the first preferred embodiment have been described above, the projections 11, 12 provided on the first electrode fingers 31 have the same effects as the projections 13, 14. Consequently, with the formation of the projections 11 to 14 in the boundary acoustic wave device 1 according to the first preferred embodiment having the IDT electrode 3 with crossing width weighting, deterioration in characteristics caused by phase shifts occurring between boundary acoustic waves propagating through the areas with the gaps 33 and 35 and boundary acoustic waves propagating through other areas can be suppressed.

Similar to the projections 13, 14, each of the projections 11, 12 has its sides tapered from the lower base towards the upper base, whereby diffraction loss can be minimized in the similar manner.

Figure 7:
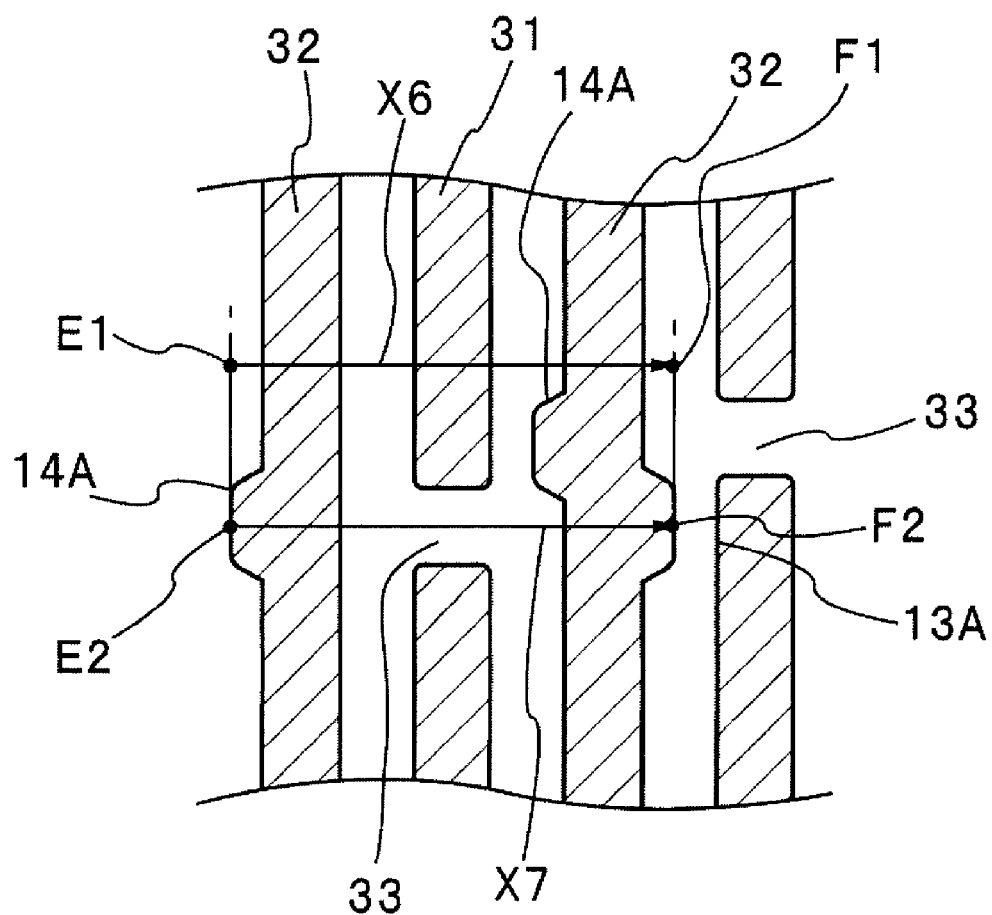
FIG. 7 is a schematic partially cutaway plan view illustrating a modification example of the boundary acoustic wave device according to the first preferred embodiment of the present invention.

In the boundary acoustic wave device 1 according to the first preferred embodiment, the projections 13, 14 preferably project toward the gaps 33 from the side edges of the second electrode fingers 32 that are proximate to the gaps 33. Alternatively, as shown in FIG. 7, projections 13A, 14A may be provided on side edges of the second electrode fingers 32 that are opposite to the sides that face the gaps 33. Even in that case, the propagation condition of a boundary acoustic wave that propagates between points E1 and F1 as shown with an arrow X6 in FIG. 7 is made similar to the propagation condition of a boundary acoustic wave that propagates between points E2 and F2 as shown with an arrow X7, thereby achieving the similar effects as in the first preferred embodiment. In other words, the projections in preferred embodiments of the present invention may be arranged on the side edges of the first electrode fingers and the second electrode fingers such that the projections project in the opposite direction of the gaps from the side edges that are opposite to those that face the gaps provided at the tip ends of the second and first electrode fingers.

Figure 8:
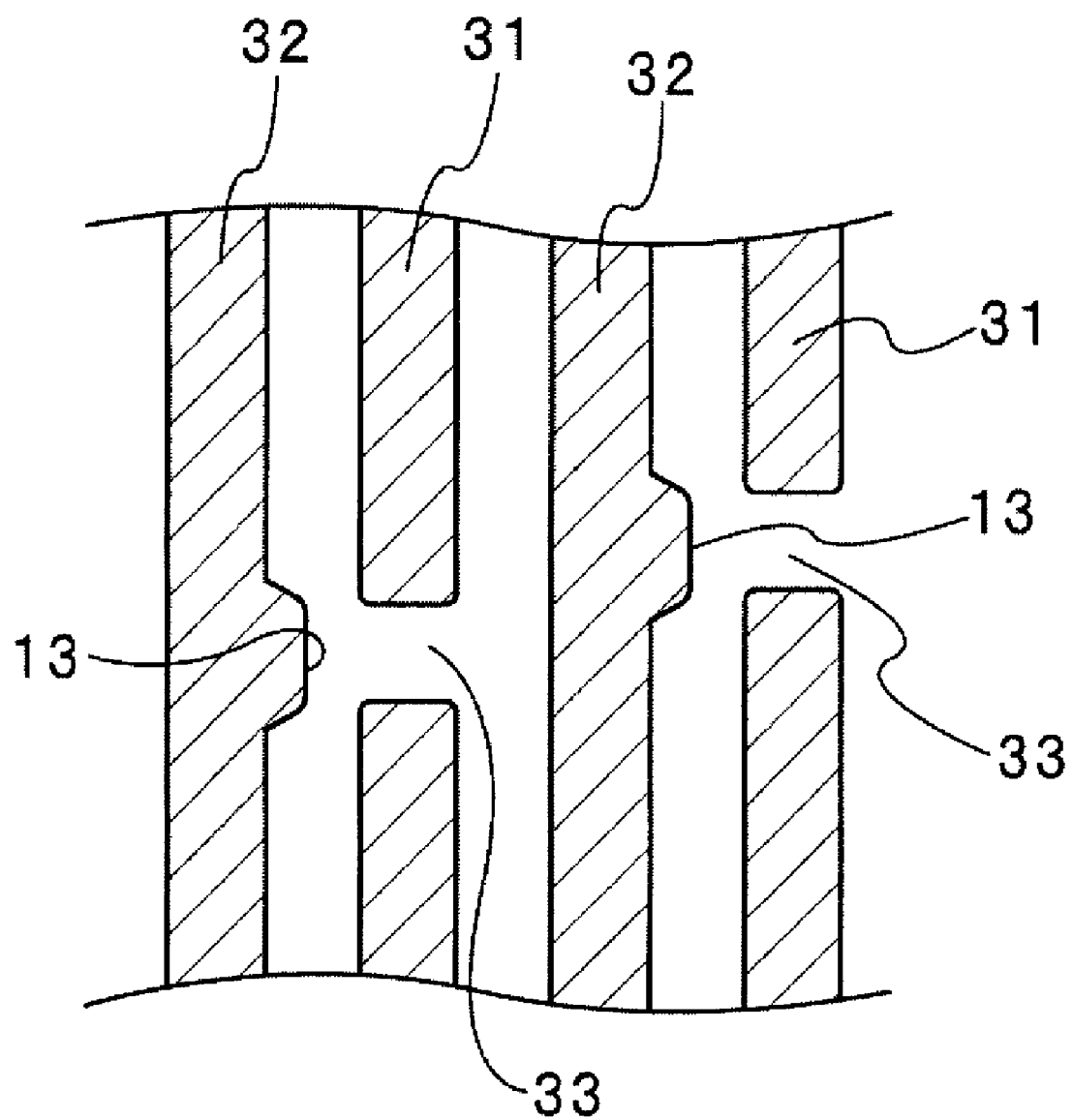
FIG. 8 is a schematic partially cutaway plan view illustrating another modification example of the boundary acoustic wave device according to the first preferred embodiment of the present invention.

FIG. 8 is a schematic plan view showing another modification example of the boundary acoustic wave device of the first preferred embodiment. In this case, each of the projections 13 is provided on a side edge of the corresponding second electrode finger 32 that is proximate to a gap 33 so as to face the gap 33. In this modification example, each second electrode finger 32 forming a pair with another second electrode finger 32 is not provided with a projection 14 that projects towards a gap 33. Specifically, of the projections 13, 14 provided in the first preferred embodiment, only one of the projections may be provided. The same applies to the first electrode fingers, where only one of the projections 11, 12 may be provided.

In other words, with respect to the gaps provided external to the tip ends of the first electrode fingers 31 and the second electrode fingers 32 in the longitudinal direction of the electrode fingers, a projection may be provided in at least one of the following positions: a position on a side edge of a first electrode finger 31 that corresponds to a gap located external to the tip end of a second electrode finger 32 in the longitudinal direction of the electrode fingers and a position on a side edge of a second electrode finger 23 that corresponds to a gap located external to the tip end of the first electrode finger 31 in the longitudinal direction of the electrode fingers.

Figure 9A:
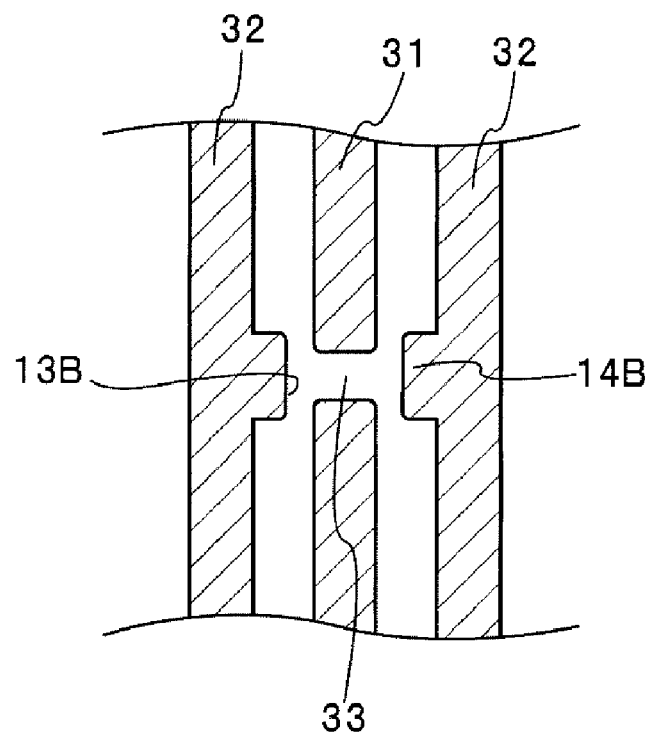
FIGS. 9A and 9B are schematic plan views illustrating other modification examples of the boundary acoustic wave device according to the first preferred embodiment of the present invention.
Figure 9B:
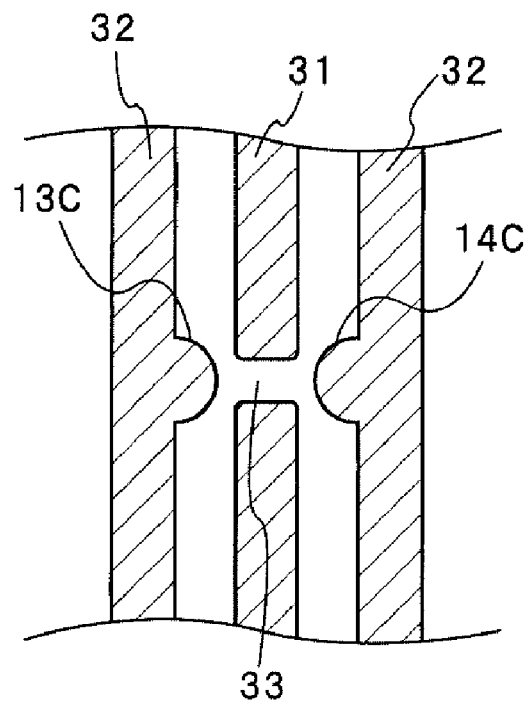

FIGS. 9A and 9B are schematic plan views illustrating other modification examples of the boundary acoustic wave device according to preferred embodiments of the present invention. Although the projections 11 to 14 preferably have an isogonal trapezoid shape in the first preferred embodiment, the shape of the projections is not limited to this shape. Specifically, rectangular or substantially rectangular projections 13B, 14B may be provided as shown in FIG. 9A, or substantially semicircular projections 13C, 14C may be provided as shown in FIG. 9B. For each of the semicircular projections 13C, 14C, the semicircular shape is constituted by a portion that continues along a side edge of the corresponding second electrode finger 32 and a circular arc portion that surrounds the portion that continues along the side edge. In this manner, a projection that is curved in at least a portion of the periphery thereof can be provided.

Specifically, in plan view, each projection may have a shape that is surrounded by a linear portion that continues along a side edge of an electrode finger and a curved periphery portion.

Even in that case, each projection is tapered such that the dimension of the projection in the longitudinal direction of the electrode fingers gradually decreases from a side edge of the corresponding electrode finger provided with the projection towards the tip end of the electrode finger. Consequently, similar to the first preferred embodiment, unfavorable diffraction loss of boundary acoustic waves can be minimized.

In the first preferred embodiment, the piezoelectric substrate 2 is preferably formed of a $LiNbO_3$ substrate and has a density of about 4.64 $g/cm^3$, and the medium layer 6 is preferably composed of $SiO_2$ and has a density of about 2.2 $g/cm^3$, for example. On the other hand, the IDT electrode 4 is preferably composed of Au and has a density of about 19.3 $g/cm^3$, for example. In such a case where the density of the IDT electrode 3 is sufficiently higher than the density of the piezoelectric substrate 2 and the density of the medium layer 6, the differences in acoustic impedance among these components become large. On the other hand, in the boundary acoustic wave device 1, the acoustic velocity ratio of boundary acoustic waves between the medium layer 6 and the IDT electrode is one of the factors that causes phase shifts and diffraction losses mentioned above. Specifically, if the differences in the acoustic impedance are large, the effects caused by phase shifts, diffraction losses, and dispersion become prominent.

Accordingly, when the acoustic impedance ratio is high, it is preferable that the projections be provided on the electrode fingers in accordance with preferred embodiments of the present invention so that the characteristics can be further enhanced.

According to observation by the present inventors, when a boundary acoustic wave device has a multilayer structure of $SiO_2$/IDT electrode/piezoelectric substrate, if the IDT electrode is composed of Al that has a density of 2.69 $g/cm^3$, the density ratio is 2.69/2.2=1.22, which is low. It is thus confirmed that the minimization and enhancement effects are small. On the other hand, when the IDT electrode is composed of Cu having a density of about 8.93 $g/cm^3$ or Au having a density of about 19.3 $g/cm^3$, the density ratio with respect to $SiO_2$ is high. Therefore, as in the first preferred embodiment, it is confirmed that the resonance characteristics can be significantly enhanced.

Accordingly, when the ratio of the density of the IDT electrode to the density of the medium layer 6 is higher than about 1.22, the effects of preferred embodiments of the present invention becomes greater. Thus, when the piezoelectric substrate 2 is defined as one medium and the medium layer composed of $SiO_2$ is defined as another medium, if the ratio of the density of the IDT electrode to the density of the medium with the higher internal density of the two media is higher than about 1.22, the effects of preferred embodiments of the present invention is expected to be even greater.

The IDT electrode does not necessarily need to be formed of a metallic film of a single layer composed only of Au or Cu. The metallic film that constitutes the IDT electrode may alternatively be formed of a multilayer metallic film having a Ni layer, a NiCr layer, or a Ti layer as a contact layer or a diffusion barrier layer stacked in the vertical direction. As an example of an IDT electrode, a multilayer film of NiCr/Au/NiCr is suitably used.

Furthermore, as a main electrode layer, a multilayer structure having an Al layer, Au layer, contact layer, and barrier layer may be suitably used. For example, a multilayer structure having Ti/Al/Ti/Ni/Au/Ni stacked to a thickness ratio of 100:10:10:55:10 can be suitably employed. Although the density ratio between Al and $SiO_2$ is low, the effects of preferred embodiments of the present invention can be attained since the density ratio between Au and $SiO_2$ is high.

Although the medium layer 6 preferably is composed solely of $SiO_2$ in the first preferred embodiment, other insulating layers, such as a SiN layer, may be stacked on the $SiO_2$ layer. When forming the medium layer 6 in a multilayer structure, the number of layers is not specifically limited. For example, a multilayer structure having three or more layers, such as $SiO_2/SiN/SiO_2$, may be used.

Figure 13A:
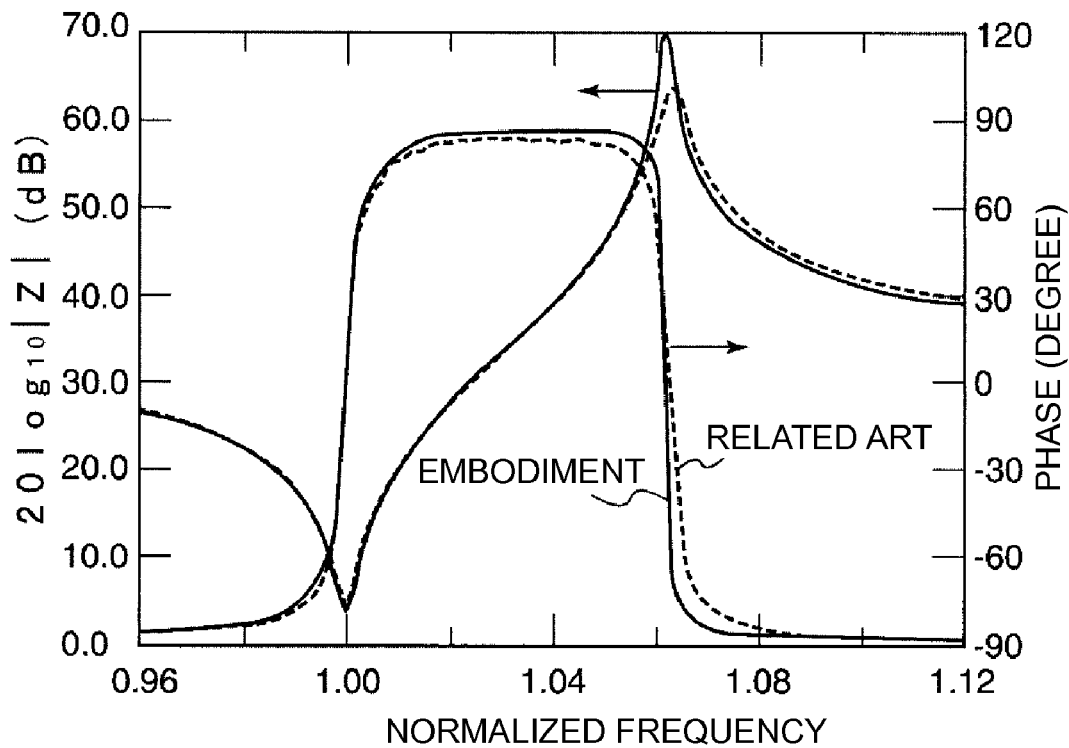
FIGS. 13A and 13B illustrate phase characteristics, impedance characteristics, and impedance characteristics at an S11 side in the boundary acoustic wave filter device according to the second preferred embodiment and the boundary acoustic wave filter device of the related art prepared for comparison.
Figure 13B:
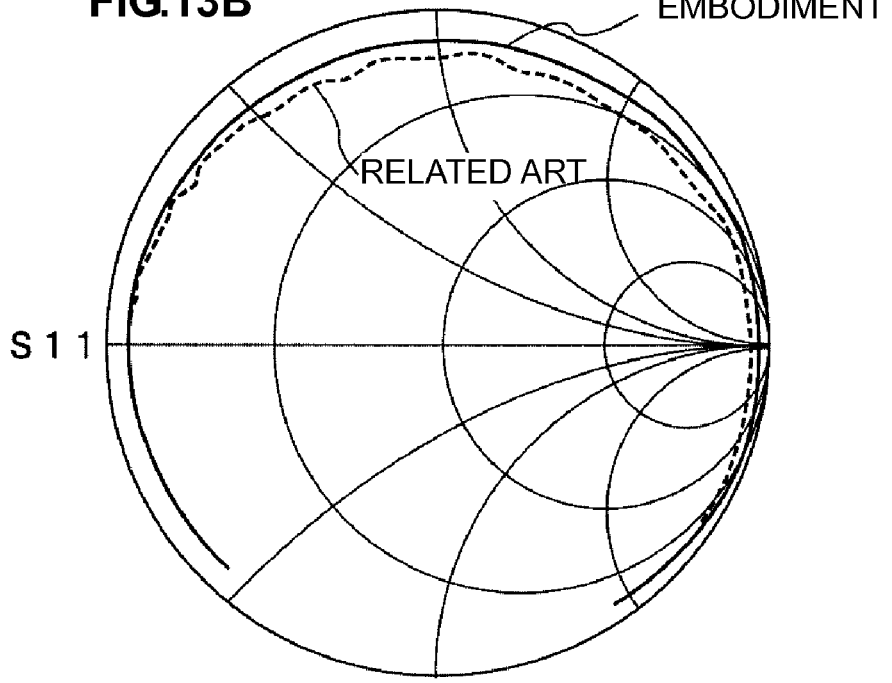

FIGS. 13A and 13B illustrate the phase characteristics, the resonance characteristics, and the impedance characteristics at an S11 side in the boundary acoustic wave filter device according to the above preferred embodiment.

When the same electrode material is used, an example of related art shown in FIG. 13(a) has a value of about 59.8 dB obtained from $20 \times (\log_{10}|Za| - \log_{10}|Zr|)$ dB, which is the ratio of resonant impedance Zr to half resonant impedance Za of a boundary acoustic wave device. On the other hand, the first preferred embodiment has a value of about 64.7 dB, which is higher.

Second Preferred Embodiment

Although the first preferred embodiment is directed to a one-port boundary acoustic wave device having a single IDT electrode 3 and reflectors 4, 5 provided on both sides of the IDT electrode 3, the present invention can also be applied to other various boundary acoustic wave devices and surface acoustic wave devices.

Figure 10:
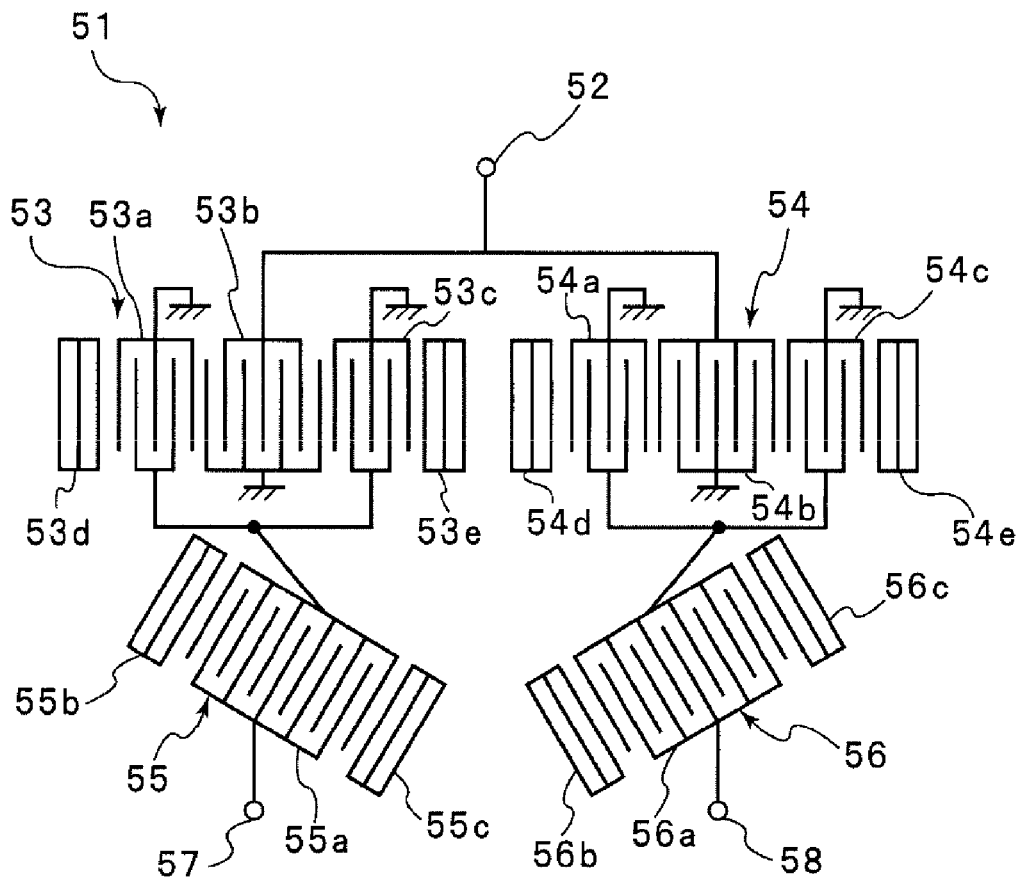
FIG. 10 is a schematic plan view showing an electrode structure of a boundary acoustic wave filter device according to a second preferred embodiment of the present invention.

FIG. 10 is a schematic plan view showing an electrode structure of a boundary acoustic wave filter device according to a second preferred embodiment of the present invention. As shown in FIG. 10, in a boundary acoustic wave device 51 according to the second preferred embodiment, an input terminal 52 has first and second resonator filter portions 53, 54 connected thereto. The resonator filter portions 53, 54 are connected to first and second output terminals 57, 58 via one-port boundary wave resonators 55, 56.

The boundary acoustic wave filter portion 53 and the boundary acoustic wave filter portion 54 are formed such that the phases of signals flowing therethrough differ from each other by 180°, thereby constituting a boundary acoustic wave filter having a balanced-to-unbalanced converting function.

In the boundary acoustic wave device 51 according to the second preferred embodiment, the first and second resonator filter portions 53, 54 respectively have three IDTs 53a to 53c and three IDTs 54a to 54c arranged in the propagation direction of boundary waves. The IDT 53b in the middle of the IDTs 53a to 53c and the IDT 54b in the middle of the IDTs 54a to 54c are crossing width weighted. The IDTs 53b and 54b with crossing width weighting are provided with projections that face corresponding gaps as in the first preferred embodiment. Moreover, reflectors 53d, 53e are disposed on both sides of the IDTs 53a to 53c. Likewise, reflectors 54d, 54e are disposed on both sides of the IDTs 54a to 54c in the propagation direction of boundary acoustic waves.

The first and second one-port boundary wave resonators 55, 56 also have IDT electrodes 55a, 56a with crossing width weighting, and similar to the first preferred embodiment, the IDTs 55a, 56a are provided with projections. Moreover, reflectors 55b, 55c, 56b, 56c are disposed on both sides of the IDTs 55a, 55b in the propagation direction of boundary acoustic waves.

An example of the boundary acoustic wave device 51 according to the second preferred embodiment is fabricated with the following specifications.

A Y-cut X-propagation $LiNbO_3$ substrate having a thickness of about 350 μm is prepared as a piezoelectric substrate, and electrodes having a five-layer structure of Al/Ti/Ni/Au/Ni are formed, whereby the electrode structure shown in FIG. 10 is fabricated. In this case, the thicknesses of the layers are as follows: Al/Ti/Ni/Au/Ni=100/10/10/55/10. The thickness of each layer is in units of nm.

As a second medium layer, $SiO_2$ is coated over the electrode structure to a thickness of about 6 μm.

The number of pairs of electrode fingers in each of the set of IDTs 53a to 53c and the set of IDTs 54a to 54c is as follows: 6.5 pairs/10.5 pairs/6.5 pairs (in the propagation direction of boundary waves). The number of electrode fingers in each reflector is 15. In each of the IDT electrodes 53a to 53c and 54a to 54c, the crossing width of electrode fingers is 25λ and the aperture is about 25.4λ. With regard to weighting, each of the IDTs 53b and 54b is crossing width weighted such that the midsection thereof in the propagation direction of boundary acoustic waves has a crossing width of 25λ and the both end portions thereof are 20λ. Moreover, each of the boundary wave resonators 55 and 56 is crossing width weighted such that the electrode-finger crossing width of the midsection of the IDT electrodes 55a or 56a in the propagation direction of boundary acoustic waves is 30λ and the crossing width of the both ends thereof is 12λ.

Furthermore, λ=1.6 μm, L=0.4 μm, S=0.4 μm, gap width G=0.3 μm. Moreover, similar to the first preferred embodiment, both first and second electrode fingers are provided with projections that face the corresponding gaps. Each projection has a projection height of about 0.2 μm, and the lower base thereof has a length of about 0.65 μm.

Figure 11:
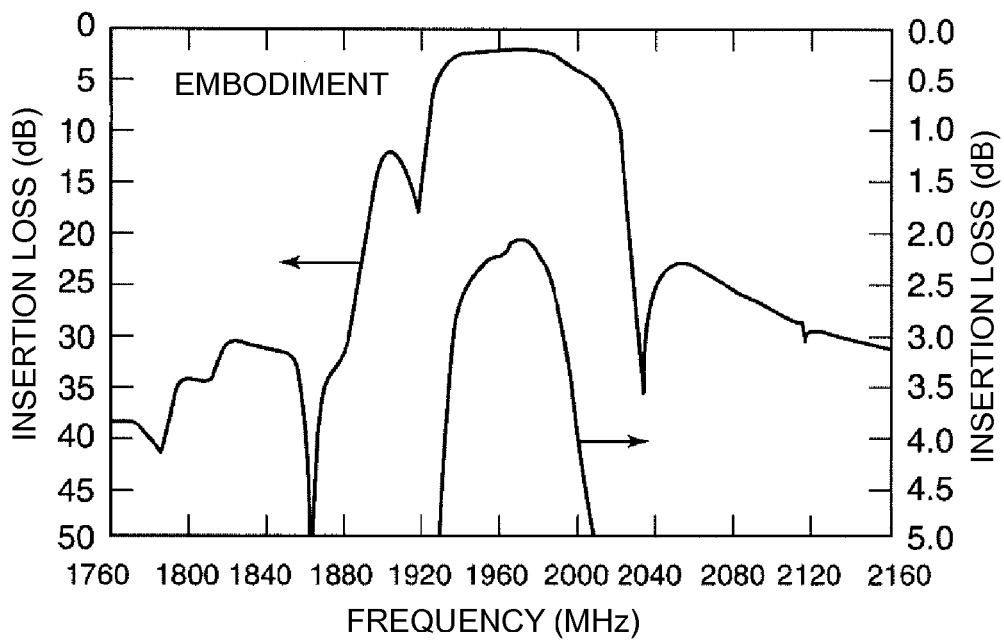
FIG. 11 illustrates filter characteristics of the boundary acoustic wave device according to the second preferred embodiment of the present invention.
Figure 12:
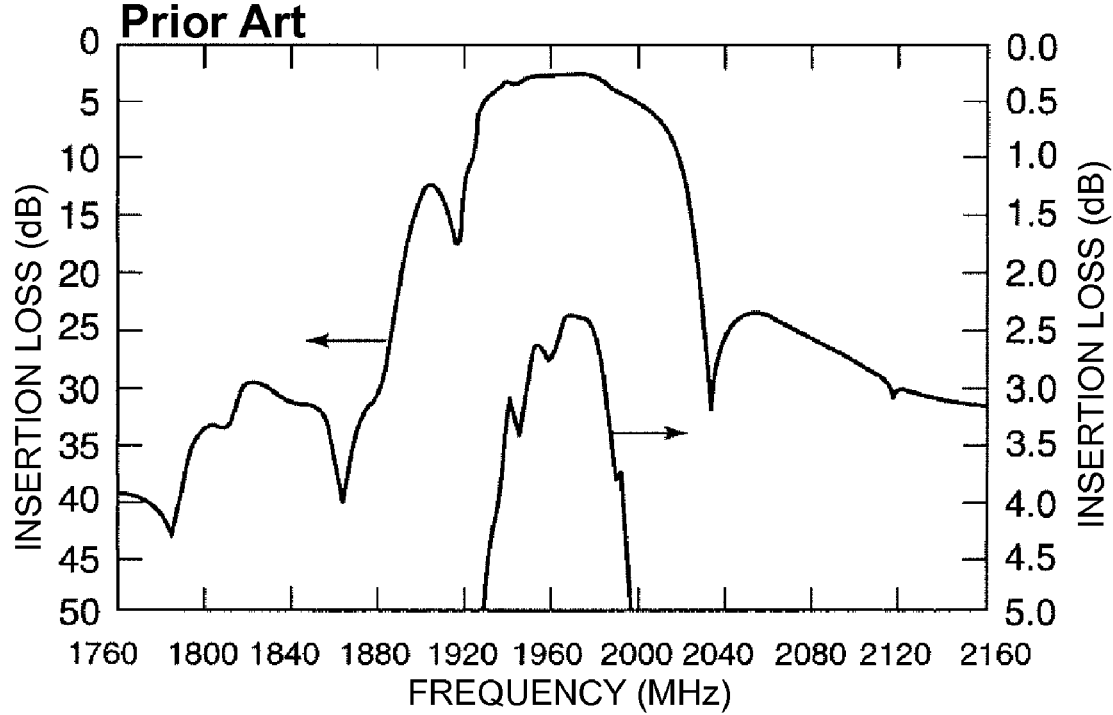
FIG. 12 illustrates filter characteristics of the boundary acoustic wave filter device of the related art prepared for comparison.

A boundary acoustic wave device equivalent to the example of related art, having a similar configuration to the above other than the fact that the projections with an isogonal trapezoid shape are not provided, is fabricated. FIGS. 11 and 12 illustrate filter characteristics of the boundary acoustic wave device according to the second preferred embodiment fabricated in the above-described manner and filter characteristics of the boundary acoustic wave filter device according to the example of related art prepared for comparison.

It is apparent from FIGS. 11 and 12 that, compared to the boundary acoustic wave filter device equivalent to the related art, a minimum insertion loss in a pass band in the boundary acoustic wave device according to the second preferred embodiment is reduced to about 0.2 dB, and the filter characteristics in the pass band is effectively flattened. This is due to the fact that, similar to the first preferred embodiment, the projections suppress phase shifts between boundary acoustic waves propagating through areas with the gaps and boundary acoustic waves propagating through areas without the gaps.

Figure 14:
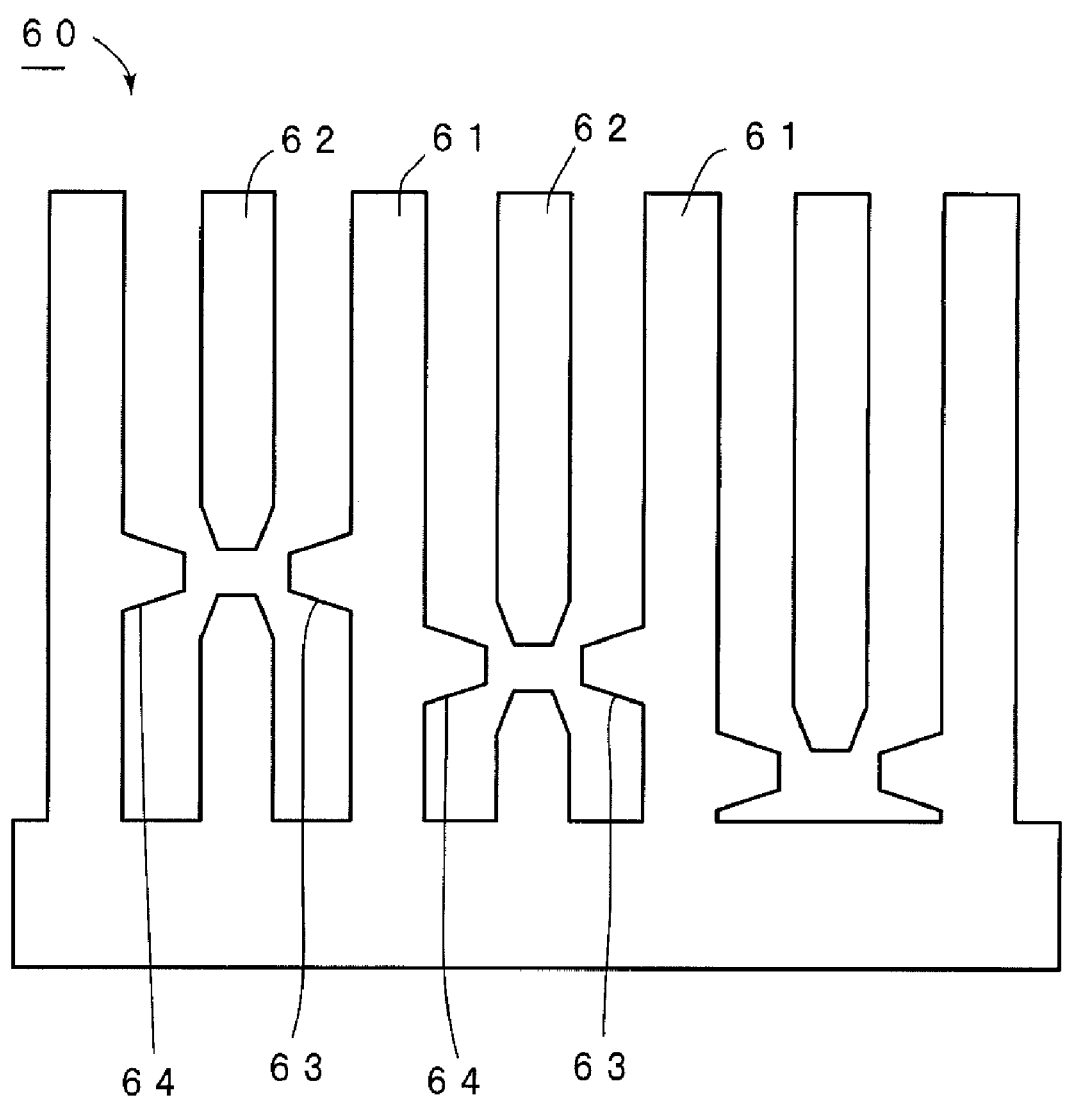
FIG. 14 is a partially cutaway plan view illustrating an IDT electrode in a boundary acoustic wave device according to a third preferred embodiment of the present invention.

Although the width of the first electrode fingers 31 and the second electrode fingers 32 in the IDT electrode 3 of the above embodiment are substantially fixed except for where the projections 13, 14 are provided, the dimension of the IDT electrode in the width direction thereof can be modified. FIG. 14 is a partial plan view showing the shape of an IDT electrode used in an elastic wave device according to a third preferred embodiment of the present invention. An IDT electrode 60 shown in FIG. 14 has first electrode fingers 61 and second electrode fingers 62 that are arranged next to each other in the propagation direction of surface acoustic waves. The side edges of the first electrode fingers 61 are provided with projections 63, 64.

On the other hand, each second electrode finger 62 has a gap G external to the tip end thereof. The width dimension of a tip end portion of the second electrode finger 62 becomes smaller towards its tip end. The projections 63, 64 on the second electrode fingers 62 are provided on the side edges of the first electrode fingers 61 at positions that correspond with the gaps G in the longitudinal direction of the electrode fingers, the gaps G being located external to the tip ends of the second electrode fingers 62. Consequently, since the tip end portions of the second electrode fingers 62 are tapered towards the tip ends thereof as mentioned above, the projections 63, 64 and the second electrode fingers 62 can be separated from each other by a sufficient distance. Accordingly, this enhances the resistance to electrical power.

Figure 15:
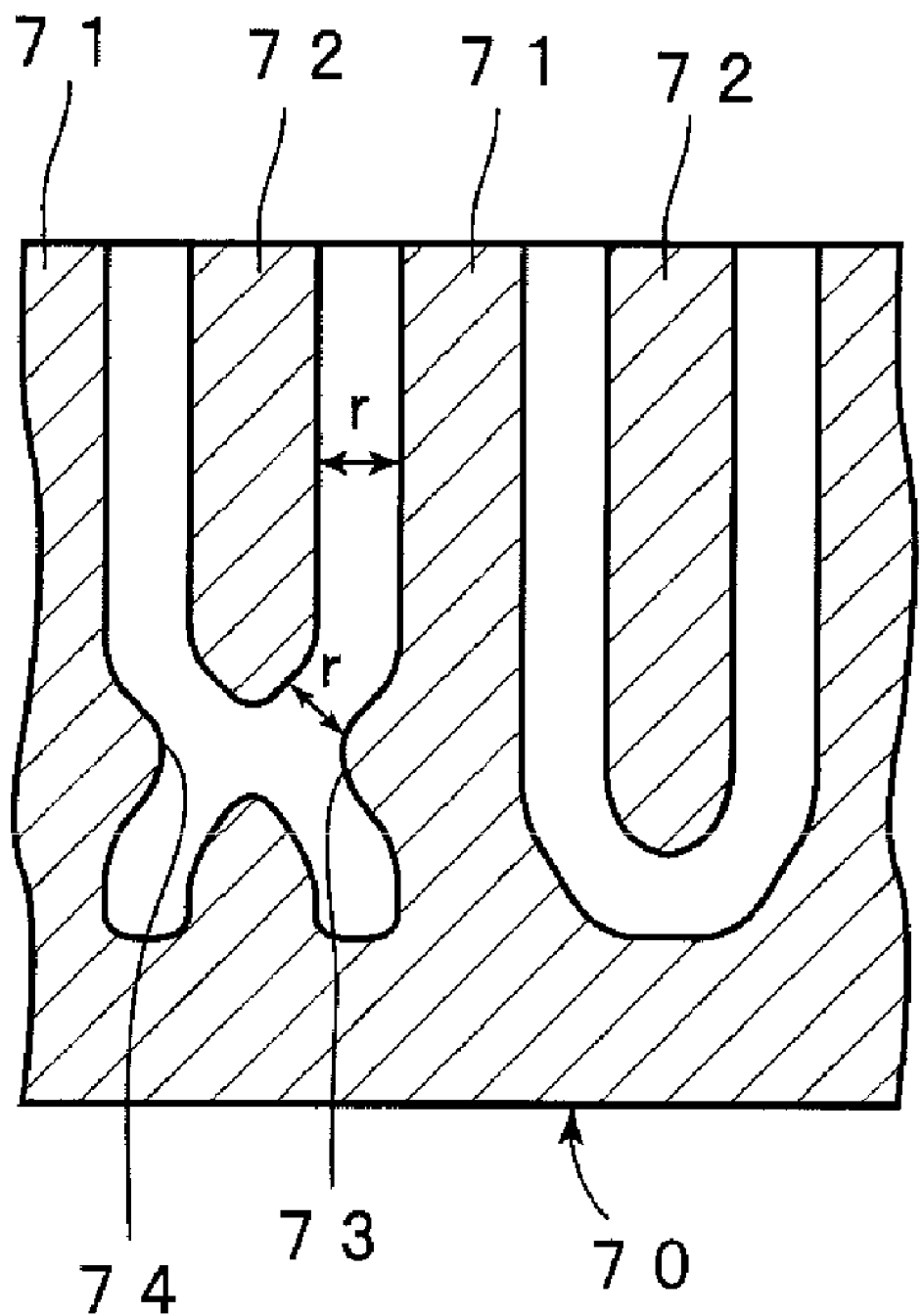
FIG. 15 is a schematic partially cutaway plan view illustrating a modification example of the IDT electrode in the boundary acoustic wave device according to the third preferred embodiment of the present invention.

FIG. 15 illustrates a modification example of the third preferred embodiment, in which an IDT electrode 70 has first electrode fingers 71 provided with projections 73, 74 on side edges thereof, and second electrode fingers 72. In FIG. 15, areas provided with an electrode material have been shaded so that areas having electrode fingers and non-metallized areas between the electrode fingers can be easily distinguished from each other.

Similar to the above, the tip end portions of the second electrode fingers 72 are tapered towards the tip ends thereof. Consequently, similar to the IDT electrode 60, the resistance to electrical power can be enhanced. In addition to the tip end portions of the second electrode fingers 72 being tapered in the IDT electrode 70, the first electrode fingers 71 and the second electrode fingers 72 are separated from each other by a substantially fixed distance r. In other words, the distance r between the first and second electrode fingers 71 and 72 connected to different electric potentials is substantially fixed. Accordingly, an electric field is uniformly imparted to the first and second electrode fingers 71 and 72, thereby further inhibiting the lowering of the resistance to electric power that can be caused by concentration of electric field.

The fact that the resistance to electric power can be enhanced when using the IDT electrode according to the third preferred embodiment shown in FIG. 14 will be described with reference to FIGS. 16 and 17 on the basis of specific test examples.

As an elastic wave device of the third preferred embodiment, a boundary acoustic wave device is fabricated by forming the IDT electrode 60 on a 15° Y-cut X-propagation LiNbO$_3$ substrate, and then stacking a SiO$_2$ film having a 6-μm thickness thereon as a medium layer.

The IDT electrode has a multilayer structure of AlCu/Ti/Ni/Au/Ni/Ti stacked in that order from the top and having thicknesses of 150 nm/10 nm/10 nm/160 nm/10 nm/10 nm, respectively.

Reflectors are placed on both sides of the IDT electrode in the propagation direction of boundary acoustic waves. The number of pairs of electrode fingers in the IDT electrode is 50, and the number of electrodes in each of the reflectors is 51. The crossing width of electrode fingers in the IDT electrode 60 is 30λ and the aperture width is 30.6λ. Furthermore, the IDT electrode is crossing width weighted such that the crossing width in the midsection of the IDT electrode is 30λ and the electrode-finger crossing width at the opposite end portions in the propagation direction of elastic waves is 12λ. In this case, λ=3.369 μm.

Figure 16:
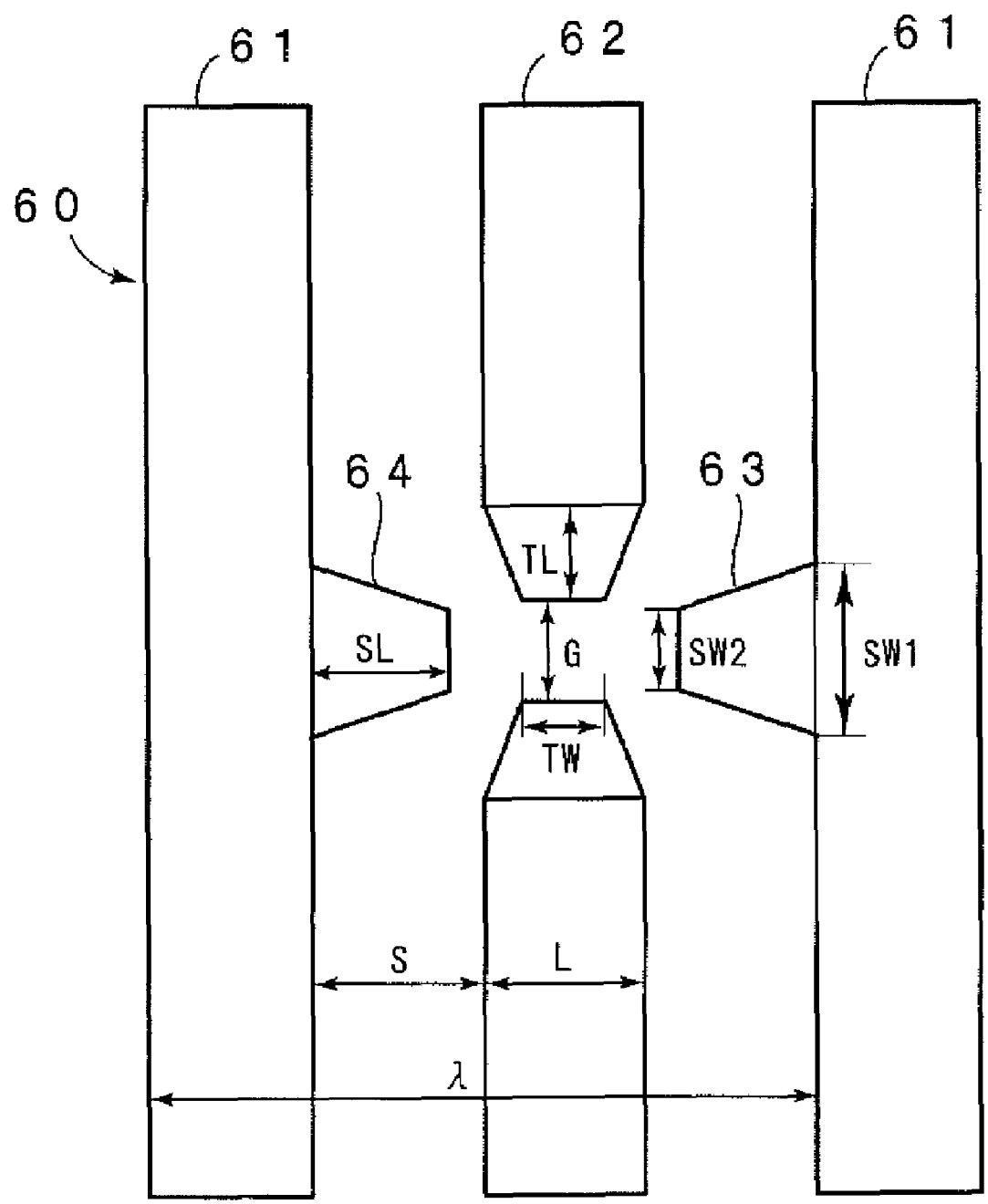
FIG. 16 is a schematic plan view illustrating a dimensional relationship between electrode fingers in a test example of the boundary acoustic wave device according to the third preferred embodiment of the present invention.

As schematically shown in FIG. 16, in the boundary acoustic wave device, the dimensions of various sections of the first and second electrode fingers 71 and 72 are given reference characters G, TL, TW, SL, SW1, and SW2, and are set to values shown in Table 1 below.

TABLE 1

|  | Related Art | First Embodiment | Second Embodiment |
|---|---|---|---|
| L |  | 1.011 μm |  |
| S |  | 0.674 μm |  |
| G | 0.6 μm | 0.500 μm | 0.360 μm |
| TL | — | — | 0.468 μm |
| TW | — | — | 0.372 μm |
| SL | — | 0.337 μm | 0.466 μm |
| SW1 | — | 1.490 μm | 1.397 μm |
| SW2 | — | 0.372 μm | 0.466 μm |

The electrostatic discharge resistance of the elastic wave device according to the third preferred embodiment obtained in this manner was measured to be 165 V.

As a comparison example, a boundary acoustic wave device of related art was fabricated, which has a similar configuration to that described above except for the fact that the first electrode fingers are not provided with the projections 63, 64 as shown in FIG. 15, that the tip end portions of the second electrode fingers are not tapered, and that the width dimension of the electrode fingers is substantially fixed. In this boundary acoustic wave device of the related art, the dimension of each gap G is about 0.6 μm. The electrostatic discharge resistance of this boundary acoustic wave device of the related art was measured to be about 173 V.

On the other hand, the boundary acoustic wave device according to the first preferred embodiment was prepared in a similar manner to the third preferred embodiment except for the fact that the tip end portions of the second electrode fingers were not tapered. In other words, the boundary acoustic wave device according to the first preferred embodiment was prepared in a similar manner to the third preferred embodiment except for the fact that the dimensions TL and TW were set equal to the dimension L. With the boundary acoustic wave device prepared in accordance with the first embodiment, the electrostatic discharge resistance was low at 130 V. This implies that by tapering the tip end portions of the second electrode fingers toward their tip ends as in the third preferred embodiment, the electrostatic discharge resistance can be effectively enhanced, whereby the resistance to electric power can be enhanced.

The impedance-versus-frequency characteristics and phase-versus-frequency characteristics of the boundary acoustic wave device according to the third preferred embodiment and the boundary acoustic wave device of the related art were measured. The results are shown in FIG. 17.

Figure 17:
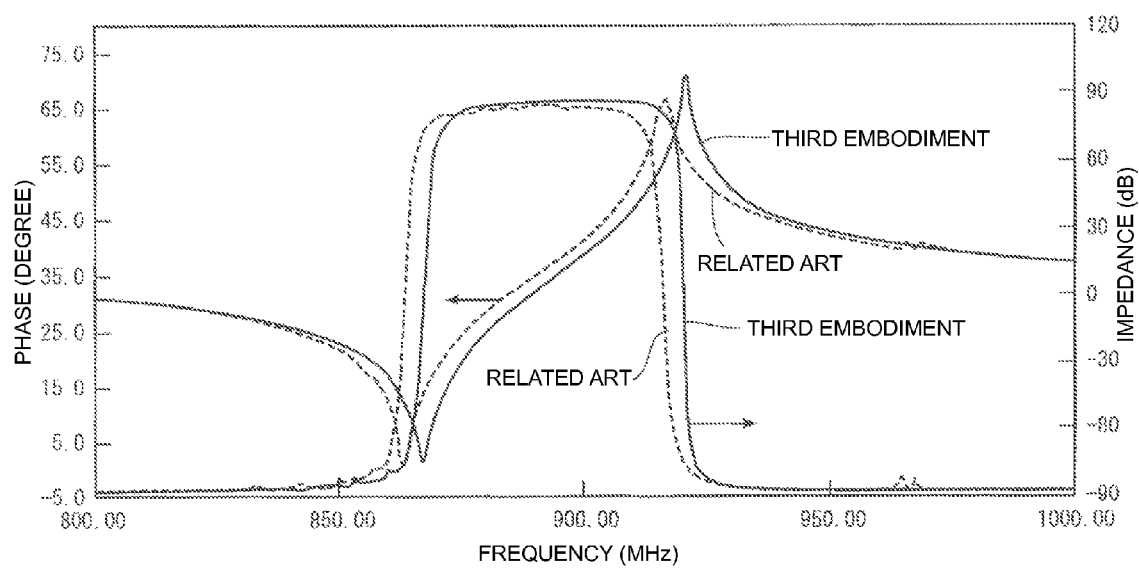
FIG. 17 illustrates phase characteristics and impedance characteristics of the boundary acoustic wave device according to the third preferred embodiment and the boundary acoustic wave device of the related art.
Figure 18:
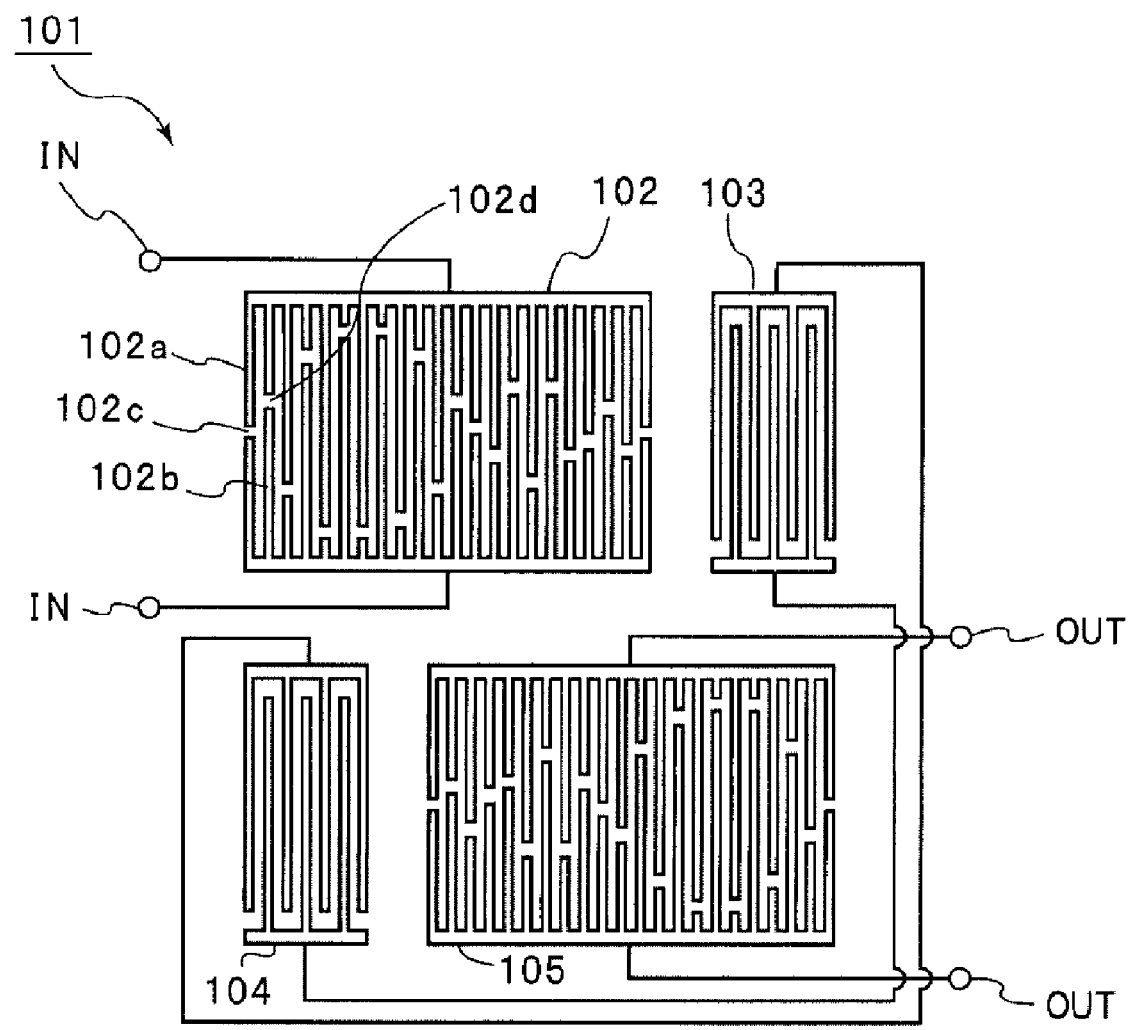
FIG. 18 is a schematic plan view showing an electrode structure of a surface acoustic wave device of related art.

As described above, although the boundary acoustic wave device of the related art had an equivalent level of electrostatic discharge resistance as the boundary acoustic wave device of the third preferred embodiment, it is apparent from FIG. 17 that there are ripples between a resonance point and an anti-resonance point on a phase-characteristic curve in the related art.

In contrast, it is apparent that there are fewer ripples in the third preferred embodiment. In addition, the anti-resonant resistance is enhanced in the third preferred embodiment. Consequently, since the impedance ratio or the top-to-valley ratio can be increased, the insertion loss can be reduced in the case of a band pass filter. Moreover, since the steepness at the edges of the pass band can be improved, the pass band can be broadened.

Although each of the first to third preferred embodiments is directed to a boundary acoustic wave device, the present invention is also applicable to surface acoustic wave devices that utilize surface acoustic waves, such as surface acoustic wave resonators and surface acoustic wave filter devices.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave device comprising:
a piezoelectric member; and
at least one IDT electrode; wherein
said at least one IDT electrode has first and second electrode fingers that are arranged next to each other in a propagation direction of elastic waves and are connected to different electric potentials;
a gap is provided external to tip ends of each of the first and second electrode fingers in a longitudinal direction of the electrode fingers;
a projection is provided in at least one of a position on a side edge of the first electrode finger and a position on a side edge of the second electrode finger in the longitudinal direction of the electrode fingers, the position on the side edge of the first electrode finger corresponding to that of the gap located external to the tip end of the second electrode finger in the longitudinal direction of the electrode fingers, the position on the side edge of the second electrode finger in the longitudinal direction of the electrode fingers corresponding to that of the gap located external to the tip end of the first electrode finger in the longitudinal direction of the electrode fingers; and
the projection projects only in the vicinity of the gap from the side edge of one of the first and second electrode fingers in a direction towards the gag provided at the tip end of another one of the first and second electrode fingers, the side edge from which the projection projects being one of the side edges that faces the gap.

2. The elastic wave device according to claim 1, wherein the projection projecting only in the vicinity of the gap is tapered toward the tip end of the another one of the first and second electrode fingers.

3. The elastic wave device according to claim 2, wherein a distance between a periphery of the first electrode finger and a periphery of the second electrode finger arranged next to the first electrode finger is substantially fixed.

4. The elastic wave device according to claim 1, wherein the projection is arranged such that an effective propagation distance in a case where an elastic wave propagates through the gaps in an area provided with the first and second electrode fingers is substantially equal to an effective propagation distance in a case where an elastic wave propagates through a section without the gaps in the area provided with the first and second electrode fingers.

5. The elastic wave device according to claim 1, wherein the projection is provided on each of the first and second electrode fingers.

6. The elastic wave device according to claim 1, wherein said at least one IDT electrode is crossing width weighted.

7. The elastic wave device according to claim 1, wherein the elastic wave comprises a surface acoustic wave.

8. The elastic wave device according to claim 7, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

9. The elastic wave device according to claim 1, wherein the elastic wave comprises a boundary acoustic wave.

10. The elastic wave device according to claim 9, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

11. The elastic wave device according to claim 9, further comprising a medium layer stacked on said at least one IDT electrode provided on the piezoelectric substrate so as to cover said at least one IDT electrode, wherein said at least one IDT electrode has a density that is equal to or higher than a density of the piezoelectric substrate and a density of the medium layer, and a ratio of the density of said at least one IDT electrode to one of the higher densities of the piezoelectric substrate and the medium layer is higher than about 1.22.

12. An elastic wave device comprising:
a piezoelectric member; and
at least one IDT electrode; wherein
said at least one IDT electrode has first and second electrode fingers that are arranged next to each other in a propagation direction of elastic waves and are connected to different electric potentials;
a gap is provided external to tip ends of each of the first and second electrode fingers in a longitudinal direction of the electrode fingers;
a projection is provided in at least one of a position on a side edge of the first electrode finger and a position on a side edge of the second electrode finger in the longitudinal direction of the electrode fingers, the position on the side edge of the first electrode finger corresponding to that of the gap located external to the tip end of the second electrode finger in the longitudinal direction of the electrode fingers, the position on the side edge of the second electrode finger in the longitudinal direction of the electrode fingers corresponding to that of the gap located external to the tip end of the first electrode finger in the longitudinal direction of the electrode fingers; and
the projection has a trapezoid shape in plan view such that a lower base of the trapezoid is defined by the side edge of the electrode finger that is provided with the projection, and wherein an internal angle formed between the lower base and sides of the trapezoid that connect an upper base and the lower base of the trapezoid is about 90° or less.

13. The elastic wave device according to claim 12, wherein if the lower base of the projection has a midpoint in the longitudinal direction of the electrode fingers and the gap at the tip end of the other electrode finger has a center in the longitudinal direction of the electrode fingers, a position of the midpoint substantially corresponds with a position of the center in the longitudinal direction of the electrode fingers, and the lower base has a length that is larger than a gap width, the gap width being a dimension of the gap in the longitudinal direction of the electrode fingers, and wherein the upper base has a length that is smaller than the gap width.

14. The elastic wave device according to claim 13, wherein the projection has an isogonal trapezoid shape in plan view.

15. The elastic wave device according to claim 12, wherein the projection has a plurality of rounded corner portions.

16. The elastic wave device according to claim 12, wherein the projection is provided on each of the first and second electrode fingers.

17. The elastic wave device according to claim 12, wherein said at least one IDT electrode is crossing width weighted.

18. The elastic wave device according to claim 12, wherein the elastic wave comprises a surface acoustic wave.

19. The elastic wave device according to claim 18, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

20. The elastic wave device according to claim 12, wherein the elastic wave comprises a boundary acoustic wave.

21. The elastic wave device according to claim 20, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

22. The elastic wave device according to claim 20, further comprising a medium layer stacked on said at least one IDT electrode provided on the piezoelectric substrate so as to cover said at least one IDT electrode, wherein said at least one IDT electrode has a density that is equal to or higher than a density of the piezoelectric substrate and a density of the medium layer, and a ratio of the density of said at least one IDT electrode to one of the higher densities of the piezoelectric substrate and the medium layer is higher than about 1.22.

23. An elastic wave device comprising:
a piezoelectric member; and
at least one IDT electrode; wherein
said at least one IDT electrode has first and second electrode fingers that are arranged next to each other in a propagation direction of elastic waves and are connected to different electric potentials;
a gap is provided external to tip ends of each of the first and second electrode fingers in a longitudinal direction of the electrode fingers;
a projection is provided in at least one of a position on a side edge of the first electrode finger and a position on a side edge of the second electrode finger in the longitudinal direction of the electrode fingers, the position on the side edge of the first electrode finger corresponding to that of the gap located external to the tip end of the second electrode finger in the longitudinal direction of the electrode fingers, the position on the side edge of the second electrode finger in the longitudinal direction of the electrode fingers corresponding to that of the gap located external to the tip end of the first electrode finger in the longitudinal direction of the electrode fingers; and
the projection has a planar shape that has a bottom side that continues from the side edge of the electrode finger and a peripheral edge that is curved except for the bottom side.

24. The elastic wave device according to claim 23, wherein if the bottom side of the projection has a midpoint in the longitudinal direction of the electrode fingers and the gap is bisected by a line with respect to the longitudinal direction of the electrode fingers, a position of the midpoint substantially corresponds with a position of the bisecting line in the longitudinal direction of the electrode fingers, and the bottom side has a length that is larger than the gap width.

25. The elastic wave device according to claim 23, wherein the projection is provided on each of the first and second electrode fingers.

26. The elastic wave device according to claim 23, wherein said at least one IDT electrode is crossing width weighted.

27. The elastic wave device according to claim 23, wherein the elastic wave comprises a surface acoustic wave.

28. The elastic wave device according to claim 27, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

29. The elastic wave device according to claim 23, wherein the elastic wave comprises a boundary acoustic wave.

30. The elastic wave device according to claim 29, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

31. The elastic wave device according to claim 29, further comprising a medium layer stacked on said at least one IDT electrode provided on the piezoelectric substrate so as to cover said at least one IDT electrode, wherein said at least one IDT electrode has a density that is equal to or higher than a density of the piezoelectric substrate and a density of the medium layer, and a ratio of the density of said at least one IDT electrode to one of the higher densities of the piezoelectric substrate and the medium layer is higher than about 1.22.

32. An elastic wave device comprising:
a piezoelectric member; and
at least one IDT electrode; wherein
said at least one IDT electrode has first and second electrode fingers that are arranged next to each other in a propagation direction of elastic waves and are connected to different electric potentials;
a gap is provided external to tip ends of each of the first and second electrode fingers in a longitudinal direction of the electrode fingers;
a projection is provided in at least one of a position on a side edge of the first electrode finger and a position on a side edge of the second electrode finger in the longitudinal direction of the electrode fingers, the position on the side edge of the first electrode finger corresponding to that of the gap located external to the tip end of the second electrode finger in the longitudinal direction of the electrode fingers, the position on the side edge of the second electrode finger in the longitudinal direction of the electrode fingers corresponding to that of the gap located external to the tip end of the first electrode finger in the longitudinal direction of the electrode fingers; and
the projection projects only in the vicinity of the gap from the at least one of the position on the side edge of the first electrode and the position on the side edge of the second electrode finger and is spaced from any other element of the at least one IDT.

33. The elastic wave device according to claim 32, wherein the projection is provided on each of the first and second electrode fingers.

34. The elastic wave device according to claim 32, wherein said at least one IDT electrode is crossing width weighted.

35. The elastic wave device according to claim 32, wherein the elastic wave comprises a surface acoustic wave.

36. The elastic wave device according to claim 35, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

37. The elastic wave device according to claim 32, wherein the elastic wave comprises a boundary acoustic wave.

38. The elastic wave device according to claim 37, further comprising a medium layer that covers said at least one IDT electrode provided on the piezoelectric substrate, wherein said at least one IDT electrode has a density that is equal to or higher than a density of the piezoelectric substrate and a density of the medium layer, and a ratio of the density of said at least one IDT electrode to the density of the medium layer is higher than about 1.22.

39. The elastic wave device according to claim 37, further comprising a medium layer stacked on said at least one IDT electrode provided on the piezoelectric substrate so as to cover said at least one IDT electrode, wherein said at least one IDT electrode has a density that is equal to or higher than a density of the piezoelectric substrate and a density of the medium layer, and a ratio of the density of said at least one IDT electrode to one of the higher densities of the piezoelectric substrate and the medium layer is higher than about 1.22.

* * * * *